United States Patent
Oshima et al.

(10) Patent No.: US 11,152,293 B2
(45) Date of Patent: Oct. 19, 2021

(54) WIRING BOARD HAVING TWO INSULATING FILMS AND HOLE PENETRATING THERETHROUGH

(71) Applicant: SHINKO ELECTRIC INDUSTRIES CO., LTD., Nagano (JP)

(72) Inventors: Kazuhiro Oshima, Nagano (JP); Hiroharu Yanagisawa, Nagano (JP); Kazuhiro Kobayashi, Nagano (JP); Katsuya Fukase, Nagano (JP); Ken Miyairi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/701,416

(22) Filed: Dec. 3, 2019

(65) Prior Publication Data

US 2020/0105651 A1 Apr. 2, 2020

Related U.S. Application Data

(62) Division of application No. 15/663,962, filed on Jul. 31, 2017, now abandoned.

(30) Foreign Application Priority Data

Aug. 9, 2016 (JP) .................................. 2016-156803

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H01L 23/16* (2013.01); (Continued)

(58) Field of Classification Search
CPC ................... H01L 23/49822; H01L 23/49811
See application file for complete search history.

(56) References Cited

U.S. PATENT DOCUMENTS 7,397,000 B2 7/2008 Shimoto et al.
2008/0012140 A1 1/2008 Tsukano et al.
(Continued)

FOREIGN PATENT DOCUMENTS

JP H11-224918 8/1999
JP 2001-168224 6/2001
(Continued)

OTHER PUBLICATIONS

Japanese Office Action dated Dec. 24, 2019 issued with respect to the basic Japanese Patent Application No. 2016-156803 with full machine translation.

*Primary Examiner* — Suberr L Chi
(74) *Attorney, Agent, or Firm* — IPUSA, PLLC

(57) ABSTRACT

A wiring board includes an insulating layer including a first insulating film provided with a first surface and a second surface that is opposite to the first surface, and composed of only resin, and a second insulating film provided with a first surface and a second surface that is opposite to the first surface, including a reinforcing member and resin, in which the reinforcing member is impregnated with the resin, and stacked on the first surface of the first insulating film such that the second surface of the second insulating film contacts the first surface of the first insulating film and the second surface of the first insulating film is exposed outside; and a first wiring layer embedded in the first insulating film, a predetermined surface of the first wiring layer being exposed from the second surface of the first insulating film.

8 Claims, 26 Drawing Sheets

(51) Int. Cl.
*H01L 23/16* (2006.01)
*H01L 23/00* (2006.01)
*H01L 21/56* (2006.01)
*H01L 23/31* (2006.01)
*H01L 23/538* (2006.01)
*H01L 23/14* (2006.01)

(52) U.S. Cl.
CPC .......... *H01L 21/561* (2013.01); *H01L 21/568* (2013.01); *H01L 23/145* (2013.01); *H01L 23/3128* (2013.01); *H01L 23/49811* (2013.01); *H01L 23/49816* (2013.01); *H01L 23/49827* (2013.01); *H01L 23/5389* (2013.01); *H01L 24/13* (2013.01); *H01L 24/16* (2013.01); *H01L 24/81* (2013.01); *H01L 24/83* (2013.01); *H01L 24/92* (2013.01); *H01L 24/97* (2013.01); *H01L 2224/13111* (2013.01); *H01L 2224/13116* (2013.01); *H01L 2224/16227* (2013.01); *H01L 2224/16238* (2013.01); *H01L 2224/26175* (2013.01); *H01L 2224/73204* (2013.01); *H01L 2224/81005* (2013.01); *H01L 2224/83005* (2013.01); *H01L 2224/92125* (2013.01); *H01L 2224/97* (2013.01); *H01L 2225/1023* (2013.01); *H01L 2225/1058* (2013.01); *H01L 2924/15311* (2013.01); *H01L 2924/15331* (2013.01); *H01L 2924/19041* (2013.01); *H01L 2924/19105* (2013.01); *H01L 2924/3511* (2013.01)

(56) References Cited

U.S. PATENT DOCUMENTS

| | | |
|---|---|---|
| 2008/0308308 A1 | 12/2008 | Kobayashi |
| 2009/0302462 A1 | 12/2009 | Hosomi et al. |
| 2010/0187003 A1 | 7/2010 | Tsai |
| 2013/0161079 A1 | 6/2013 | Maeda et al. |
| 2013/0199832 A1 | 8/2013 | Galster et al. |
| 2014/0021625 A1 | 1/2014 | Nakamura et al. |
| 2016/0021744 A1* | 1/2016 | Baek ............... H01L 23/49811 174/250 |
| 2016/0064319 A1* | 3/2016 | Suzuki ............... H05K 3/4682 174/251 |
| 2016/0088727 A1 | 3/2016 | Furutani et al. |
| 2016/0150651 A1 | 5/2016 | Tsai et al. |

FOREIGN PATENT DOCUMENTS

| | | |
|---|---|---|
| JP | 2005-327780 | 11/2005 |
| JP | 2007-329303 | 12/2007 |
| JP | 2008-021921 | 1/2008 |
| JP | 2010-171387 | 8/2010 |
| JP | 2013-018993 | 1/2013 |
| JP | 2013-149941 | 8/2013 |
| JP | 2016-035969 | 3/2016 |
| JP | 2016-063130 | 4/2016 |

\* cited by examiner

WIRING BOARD HAVING TWO INSULATING FILMS AND HOLE PENETRATING THERETHROUGH

CROSS-REFERENCE TO RELATED APPLICATIONS

This application is a divisional of U.S. patent application Ser. No. 15/663,962 filed on Jul. 31, 2017, which is based on and claims priority to Japanese patent application No. 2016-156803 filed on Aug. 9, 2016. The entire contents of these applications are hereby incorporated by reference.

FIELD

The present invention relates to a wiring board.

BACKGROUND

Conventionally, a so-called build-up wiring board is known in which wiring layers and insulating layers are alternately stacked and the wiring layers are connected through via holes that penetrate the insulating layer. In such a wiring board, if the insulating layer does not include a reinforcing member, the wiring board may be weak. Thus, a so-called prepreg including a reinforcing member impregnated with insulating resin is used as an outermost insulating layer to retain strength of a wiring board (see Patent Document 1, for example).

However, if such prepreg is used as an outermost insulating layer, when the outermost insulating layer is made thin, a reinforcing member such as a glass cloth may contact a wiring layer embedded in the outermost insulating layer to lower insulation reliability.

Further, melt viscosity of the prepreg is high and the resin cannot be sufficiently embedded. Thus, if wirings of the wiring layer embedded in the outermost insulating layer are fine, the resin may not be sufficiently provided between the wirings and voids or the like may be generated. As a result, insulation reliability may be lowered.

PATENT DOCUMENT

Patent Document 1: Japanese Patent No. 4,108,643

SUMMARY

The present invention is made in light of the above problems, and provides a wiring board whose strength is retained and insulation reliability is improved.

According to an embodiment, there is provided a wiring board including an insulating layer including a first insulating film provided with a first surface and a second surface that is opposite to the first surface, and composed of only resin, and a second insulating film provided with a first surface and a second surface that is opposite to the first surface, including a reinforcing member and resin, in which the reinforcing member is impregnated with the resin, and stacked on the first surface of the first insulating film such that the second surface of the second insulating film contacts the first surface of the first insulating film and the second surface of the first insulating film is exposed outside; and a first wiring layer embedded in the first insulating film, a predetermined surface of the first wiring layer being exposed from the second surface of the first insulating film.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
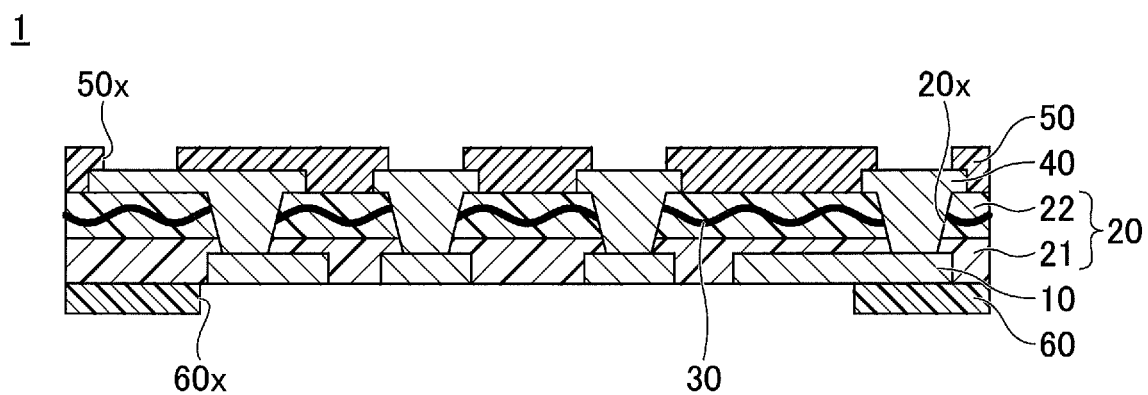
FIG. 1A and FIG. 1B are views illustrating an example of a wiring board of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Board of First Embodiment

Figure 1B:
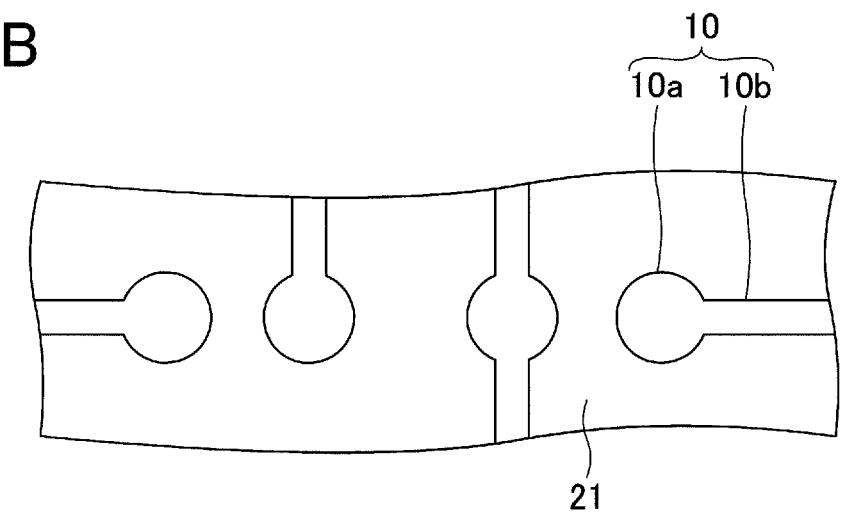

First, a structure of a wiring board of a first embodiment is described. FIG. 1A and FIG. 1B are views illustrating an example of a wiring board 1 of the first embodiment. FIG. 1A is a cross-sectional view, and FIG. 1B is a partial bottom view.

With reference to FIG. 1A, the wiring board 1 of the first embodiment is a coreless build-up wiring board including a wiring layer 10, an insulating layer 20, a wiring layer 40 and solder resist layers 50 and 60.

In this embodiment, a solder resist layer 50 side of the wiring board 1 is referred to as an upper side or one side, and a solder resist layer 60 side of the wiring board 1 is referred to as a lower side or the other side. Further, a surface of each component at the solder resist layer 50 side is referred to as one surface, an upper surface or a first surface, and a surface of each component at the solder resist layer 60 side is referred to as the other surface, a lower surface or a second surface. However, the wiring board 1 may be used in an opposite direction or may be used at an arbitrary angle. Further, in this embodiment, "in a planar view" means that an object is seen in a direction that is normal to one surface of the solder resist layer 50, and a "planar shape" means a shape of an object seen in the direction that is normal to the one surface of the solder resist layer 50.

With reference to FIG. 1B, in the wiring board 1, the wiring layer 10, which is a first wiring layer, includes a plurality of pads 10a, which are connection terminals with a semiconductor chip, and wiring patterns 10b to each of which the pad 10a is connected. Here, mainly, a portion of the wiring layer 10 that is exposed from an open portion 60x of the solder resist layer 60 is the pads 10a, and a portion of the wiring layer 10 that is covered by the solder resist layer 60 is the wiring patterns 10b. However, a portion of the wiring patterns 10b may be exposed from the open portion 60x of the solder resist layer 60. As the material of the wiring layer 10, for example, copper (Cu) or the like may be used. The thickness of the wiring layer 10 may be, for example, about 1 to 35 μm.

The insulating layer 20 includes a first insulating film 21, and a second insulating film 22 that is stacked on an upper surface (one surface) of the first insulating film 21. The first insulating film 21 is an outermost insulating layer, and a portion of a lower surface (the other surface) of the first insulating film 21 is exposed outside the wiring board 1. In this embodiment, a lower surface of the first insulating film 21 is a chip mounting surface on which a semiconductor chip is to be mounted. The first insulating film 21 is composed of only insulating resin. In this specification, "composed of only insulating resin" means that it does not include a reinforcing member, but may include an additive such as filler.

The first insulating film 21 covers the wiring layer 10. More detail, the first insulating film 21 covers a side surface and an upper surface of the wiring layer 10. In other words, the wiring layer 10 is embedded in the first insulating film 21, and the lower surface of the wiring layer 10 is exposed from the lower surface of the first insulating film 21. The lower surface of the first insulating film 21 and the lower surface of the wiring layer 10 may be flush with each other, for example.

As the insulating resin for the first insulating film 21, for example, epoxy-based resin, imide-based resin, phenol-based resin, cyanate-based resin or the like may be used. The insulating resin for the first insulating film 21 may be, for example, thermosetting resin. The thickness of the first insulating film 21 may be, for example, about 1 to 100 μm. The first insulating film 21 may include filler such as silica ($SiO_2$) or the like.

The second insulating film 22 includes a reinforcing member 30 impregnated with insulating resin. In this specification, "includes a reinforcing member impregnated with insulating resin" means that the insulating film at least includes the reinforcing member and the insulating resin, and the insulating film may include an additive such as filler as well.

As the reinforcing member 30, for example, a woven cloth, a nonwoven cloth or the like such as glass fiber, carbon fiber or aramid fiber may be used. As the insulating resin for the second insulating film 22, for example, epoxy-based resin, imide-based resin, phenol-based resin, cyanate-based resin or the like may be used. The insulating resin for the second insulating film 22 may be, for example, thermosetting resin. The thickness of the second insulating film 22 may be, for example, about 15 to 200 μm. The second insulating film 22 may include filler such as silica ($SiO_2$) or the like.

The type or the thickness of the insulating resin used for the first insulating film 21 and the second insulating film 22 may be independently determined. This means that same insulating resin may be used for the first insulating film 21 and the second insulating film 22, or different insulating resin may be used for first insulating film 21 and the second insulating film 22. Further, the first insulating film 21 and the second insulating film 22 may have the same thickness, or have different thicknesses. Further, either one of the first insulating film 21 and the second insulating film 22 may include filler, or both of the first insulating film 21 and the second insulating film 22 may include filler. Further, when both of the first insulating film 21 and the second insulating film 22 include filler, the type of the filler or the content of the filler may be the same or may be different. Here, for each of the first insulating film 21 and the second insulating film 22, by setting CTE (coefficient of thermal expansion) to be lower than or equal to 15 ppm/° C. by adjusting the type or the thickness of the insulating resin, or the type, the content or the like of the filler, warping of the wiring board 1 can be suppressed.

The wiring layer 40, which is a second wiring layer, is formed on the insulating layer 20. The insulating layer 20 includes open portions 20x, which are via holes, penetrating the insulating layer 20 (second insulating film 22 and the first insulating film 21) to expose the upper surface of the wiring layer 10. The wiring layer 40 includes via wirings filled in the open portions 20x, respectively, and wiring patterns formed on an upper surface of the second insulating film 22. Each of the open portions 20x is a concave portion having an inverse cone trapezoid shape where the diameter of a portion open at the solder resist layer 50 side is larger than the diameter of a bottom portion of the respective open portion 20x formed at the upper surface of the wiring layer 10.

The wiring layer 40 is electrically connected to the wiring layer 10 exposed at the bottom portion of each of the open portions 20x. As the material of the wiring layer 40, for example, copper (Cu) or the like may be used. The thickness of the wiring pattern constituting the wiring layer 40 may be, for example, about 1 to 35 μm.

The solder resist layer 50 is formed on the upper surface of the second insulating film 22 so as to cover the wiring layer 40. The solder resist layer 50 includes open portions 50x, and a portion of the wiring layer 40 is exposed at a bottom portion of each of the open portions 50x. The wiring layer 40 exposed at the bottom portion of each of the open portions 50x functions as a pad that is electrically connected to another wiring board, a semiconductor package, a semiconductor chip or the like. As the material of the solder resist layer 50, for example, photosensitive epoxy-based insulating resin, acryl-based insulating resin or the like may be used. The thickness of the solder resist layer 50 may be, for example, about 5 to 40 μm.

As necessary, a metal layer may be formed on an upper surface of the wiring layer 40 exposed in each of the open portions 50x. As an example of the metal layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Alternatively, instead of foaming the metal layer, an antioxidation process such as an Organic Solderability Preservative (OSP) process may be performed. A surface treatment layer formed by the OSP process is an organic coating film composed of an azole compound, an imidazole compound or the like.

The solder resist layer 60 is formed on the lower surface of the first insulating film 21 so as to cover the wiring layer 10. The solder resist layer 60 includes the open portion 60x, and the pads 10a of the wiring layer 10 are mainly exposed at a bottom portion of the open portion 60x. As the material of the solder resist layer 60, for example, photosensitive epoxy-based insulating resin, acryl-based insulating resin or the like may be used. The thickness of the solder resist layer 60 may be, for example, about 5 to 40 μm. As necessary, the above described metal layer may be formed, or the antioxidation process may be performed on the lower surface of the wiring layer 10 that is exposed at the open portion 60x.

The pads 10a of the wiring layer 10 that are adjacent from each other are provided with a space of about a few μm to some tens of μm. Thus, it is difficult to provide a plurality of open portions that expose lower surfaces of all of the pads 10a of the wiring layer 10, respectively, in the solder resist layer 60. Thus, in this embodiment, a single open portion 60x that exposes all of the pads 10a of the wiring layer 10 is provided in the solder resist layer 60. However, for example, when the pads 10a are not provided in such a narrow pitch, a plurality of open portions each individually exposes the lower surface of the respective pad 10a may be provided in the solder resist layer 60.

Method of Manufacturing Wiring Board of First Embodiment

Next, a method of manufacturing the wiring board 1 of the first embodiment is described. FIG. 2A to FIG. 3C are views illustrating an example of manufacturing steps of the wiring board 1 of the first embodiment. In this embodiment, an example of manufacturing steps is described in which parts corresponding to the plurality of the wiring boards are manufactured on a support body, and after removing the support body, the plurality of wiring boards are manufactured by individualizing the parts. Alternatively, as another example of manufacturing steps, a single wiring board may be manufactured on a support body and the support body may be removed to obtain the wiring board.

Figure 2A:
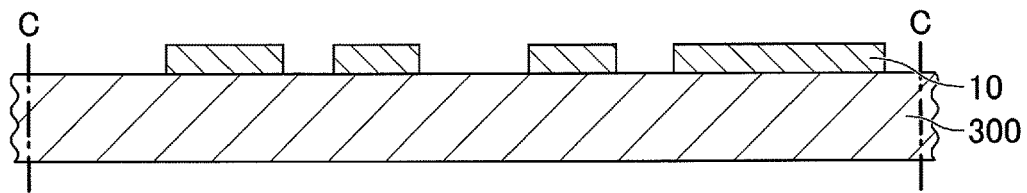
FIG. 2A to FIG. 2D are views illustrating an example of manufacturing steps of the wiring board of the first embodiment.

First, in a step illustrated in FIG. 2A, a support body 300 whose upper surface is a flat surface is prepared. Then, the wiring layer 10 is formed on the upper surface of the support body 300. As the support body 300, a metal plate, a metal foil or the like may be used. In this embodiment, an example is described in which a copper foil is used as the support body 300. The thickness of the support body 300 may be, for example, about 18 to 100 μm.

For forming the wiring layer 10, first, a resist layer (dry film resist or the like, for example), provided with open portions corresponding to parts where the wiring layer 10 is formed, is formed on the upper surface of the support body 300. Then, by electrolytic plating or the like in which the support body 300 is used as a power supply layer, the wiring layer 10 is formed on the upper surface of the support body 300 exposed in each of the open portions of the resist layer. Thereafter, the resist layer is removed. The material and the thickness of the wiring layer 10 are as described above.

Figure 2B:
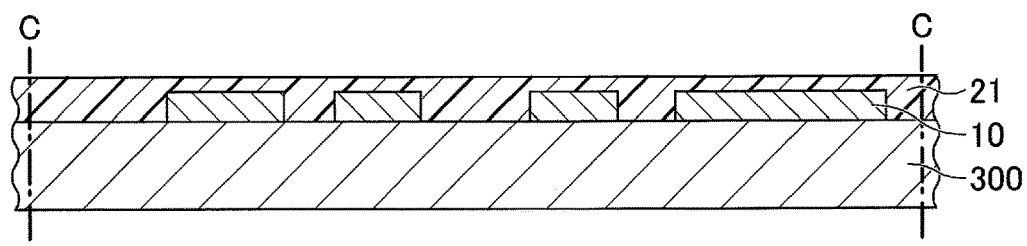

Next, in a step illustrated in FIG. 2B, for example, thermosetting epoxy-based insulating resin or the like is laminated on the upper surface of the support body 300 so as to cover the upper surface and the side surface of the wiring layer 10 to form the first insulating film 21 at a B-stage state (semi-cured state). As described above, the first insulating film 21 is composed of only insulating resin. In this step, the first insulating film 21 is not cured.

Here, in the step of forming the wiring layer 10, instead of using the resist layer such as the dry film resist, a photosensitive permanent insulating film including open portions may be used. In such a case, after forming the wiring layer 10 in each of the open portions of the permanent insulating film, the permanent insulating film may not be removed, and the permanent insulating film may be used as the first insulating film 21.

Figure 2C:
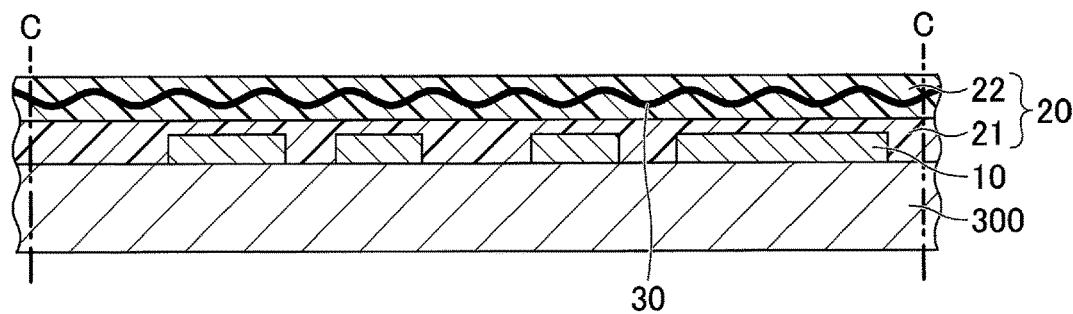

Next, in a step illustrated in FIG. 2C, for example, thermosetting epoxy-based insulating resin or the like is laminated on the upper surface of the first insulating film 21 to form the second insulating film 22 at a B-stage state (semi-cured state) stacked on the first insulating film 21. As described above, the second insulating film 22 is a so-called prepreg obtained by impregnating the reinforcing member 30 with the insulating resin. The material of the reinforcing member 30 is as described above. After stacking the second insulating film 22 on the upper surface of the first insulating film 21, the first insulating film 21 and the second insulating film 22 are heated at predetermined temperature to be cured to manufacture the insulating layer 20. As necessary, the first insulating film 21 and the second insulating film 22 may be heated while being pressurized.

Compared with melt viscosity of the first insulating film 21 composed of only resin, melt viscosity of the second insulating film 22 including the reinforcing member 30 is high. In this embodiment, as the wiring layer 10 is covered by the first insulating film 21 whose melt viscosity is relatively low, even when wiring density of the wiring layer 10 is high, or when a ratio of copper of the wiring layer 10 is high, melted insulating resin can be introduced between wirings of the wiring layer 10. Thus, voids, which may be easily generated when the wiring layer 10 is covered by an insulating film including a reinforcing member and whose melt viscosity is relatively high because the insulating resin cannot be introduced between wirings of the wiring layer 10, are not formed easily. The ratio of copper means a ratio of area of the wiring layer at a surface of the insulating layer.

Further, in general, if the wiring layer contacts the reinforcing member, migration may be generated along the reinforcing member. For example, when a glass cloth is used as the reinforcing member, migration may be generated along a fiber of the glass cloth, and adjacent wiring patterns may be short-circuited. However, according to the wiring board 1, the wiring layer 10 does not contact the reinforcing member, and generation of migration can be suppressed. Thus, insulation reliability of the wiring board 1 can be improved.

In particular, according to the wiring board 1, the outermost wiring layer 10 includes the wiring patterns 10b in addition to the pads 10a. Thus, at some areas, the ratio of copper may become large. However, even in such a case, the first insulating film 21 whose melt viscosity is relatively low can be introduced between a space between the wirings of the wiring layer 10 and the wiring layer 10 can be sufficiently embedded.

Figure 2D:
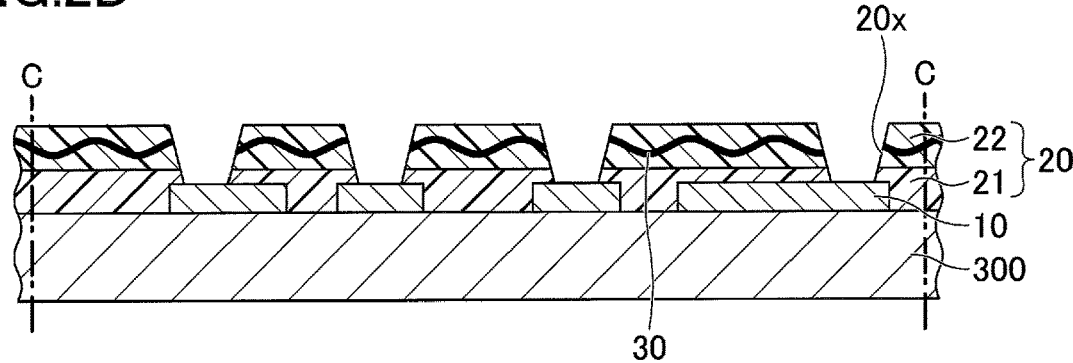

Next, in a step illustrated in FIG. 2D, the open portions 20x, that are the via holes each penetrating the insulating layer 20 (the second insulating film 22 and the first insulating film 21) to expose the upper surface of the wiring layer 10, are formed in the insulating layer 20. The open portions 20x may be formed by, for example, laser processing using $CO_2$ laser or the like. Each of the open portions 20x formed by the laser processing becomes a concave portion having an inverse cone trapezoid shape where the diameter of a portion open at the solder resist layer 50 side is larger than the diameter of a bottom portion of the respective open portion 20x formed at the upper surface of the wiring layer 10. When the open portions 20x are formed by the laser processing, it is preferable that resin residue of the insulating layer 20 adhered on the upper surface of the wiring layer 10 exposed at the bottom portion of each of the open portions 20x is removed by performing a desmear process.

There is a case that different resin is used for the first insulating film 21 than for the second insulating film 22, or filler contents are different for the first insulating film 21 and the second insulating film 22. In such a case, irradiating conditions of laser or the like may be changed for a step of irradiating laser on the second insulating film 22 and a step of irradiating laser on the first insulating film 21 after the second insulating film 22 is penetrated. This is performed so as not to generate a step at an inner wall surface of each of the open portions 20x at an interface between the first insulating film 21 and the second insulating film 22. Alternatively, it is possible to control the shape of the inner wall surface of each of the open portions 20x by adjusting a condition of the desmear process.

Figure 3A:
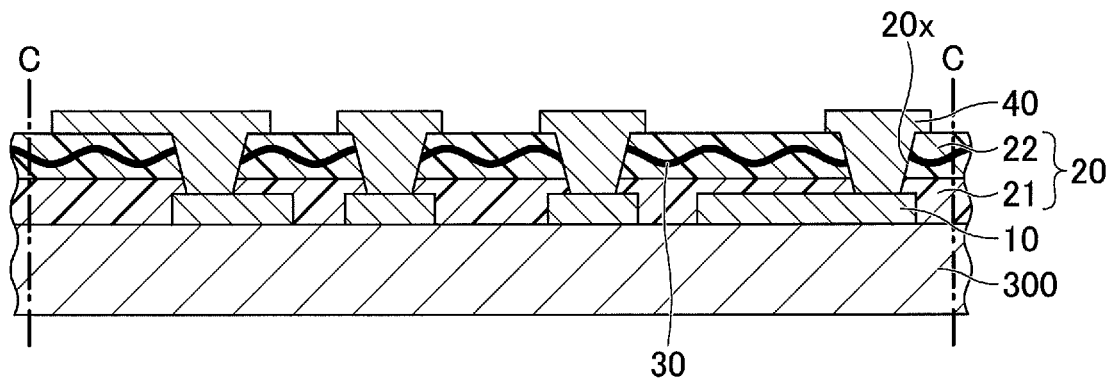
FIG. 3A to FIG. 3C are views illustrating an example of the manufacturing steps of the wiring board of the first embodiment.

Next, in a step illustrated in FIG. 3A, the wiring layer 40 is formed on the insulating layer 20. The wiring layer 40 is formed to include the via wirings filled in the open portions 20x, respectively, and the wiring patterns formed on the upper surface of the insulating layer 20. The wiring layer 40 is electrically connected to the wiring layer 10 that is exposed at the bottom portion of each of the open portions 20x. As the material of the wiring layer 40, for example, copper (Cu) or the like may be used. The wiring layer 40 may be formed by various wiring layer forming methods such as a semi-additive method or a subtractive method.

Figure 3B:
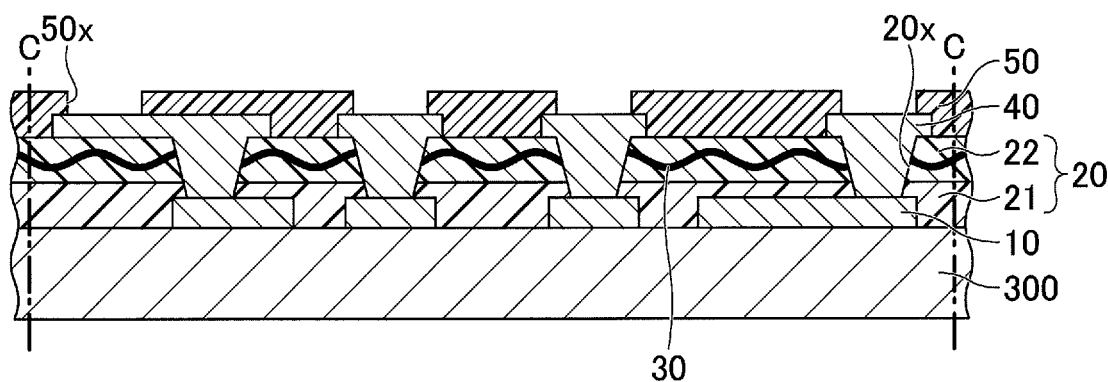

Next, in a step illustrated in FIG. 3B, the solder resist layer 50 that covers the wiring layer 40 is formed on the insulating layer 20. The solder resist layer 50 may be formed by, for example, coating liquid or paste photosensitive epoxy-based insulating resin, acryl-based insulating resin or the like on the insulating layer 20 so as to cover the wiring layer 40 by screen printing, roll coating, spin coating or the like. Alternatively, for example, the solder resist layer 50 may be formed by laminating a photosensitive epoxy-based insulating resin film, an acryl-based insulating resin film or the like on the insulating layer 20 so as to cover the wiring layer 40.

Then, by exposing and developing the coated or laminated insulating resin, the open portions 50x are formed (photolithography). With this, the solder resist layer 50 provided with the open portions 50x is formed. Alternatively, an insulating resin film previously provided with the open portions 50x may be laminated on the insulating layer 20 so as to cover the wiring layer 40. Further, as the material of the solder resist layer 50, non-photosensitive insulating resin may be used. In such a case, the open portions 50x may be formed by, for example, laser processing using $CO_2$ laser or the like, or blasting using an abrasive such as alumina abrasive grains, after forming the solder resist layer 50 on the insulating layer 20 and curing it. Alternatively, the solder resist layer 50 provided with the open portions 50x may be formed by screen printing.

With this, a part of the wiring layer 40 is exposed in the open portions 50x. The wiring layer 40 exposed in each of the open portions 50x functions as a pad that is electrically connected to another wiring board, a semiconductor package, a semiconductor chip or the like. As necessary, a metal layer may be formed on the upper surface of the wiring layer 40 that is exposed at the bottom portion of each of the open portions 50x by electroless plating or the like, for example. An example of the metal layer is as described above. Further, an antioxidation process such as an OSP process may be performed on the upper surface of the wiring layer 40 exposed at the bottom portion of each of the open portions 50x. The step of forming the solder resist layer 50 may be performed after the support body 300 is removed. In such a case, the solder resist layer 50 and the solder resist layer 60 may be formed at the same time.

Figure 3C:
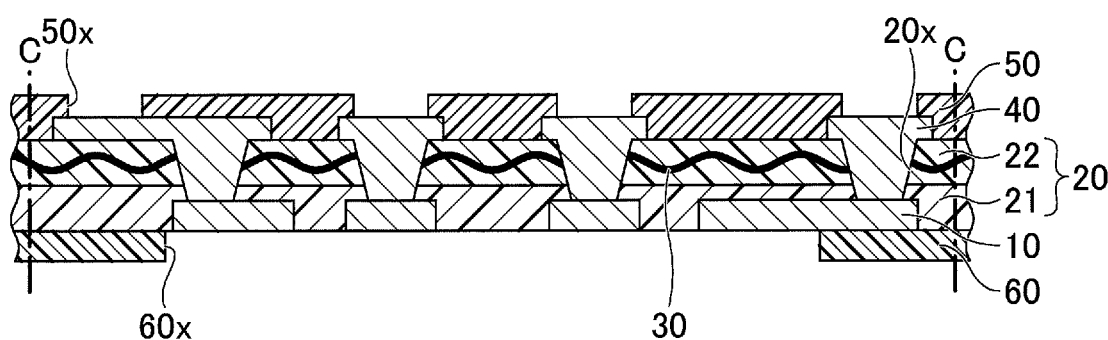

Next, in a step illustrated in FIG. 3C, after removing the support body 300 illustrated in FIG. 3B, the solder resist layer 60 provided with the open portion 60x that mainly exposes the pads 10a of the wiring layer 10 is formed on the lower surface of the insulating layer 20. The support body 300, which is the copper foil, may be removed by, for example, wet etching using ferric chloride aqueous solution, cupric chloride aqueous solution, ammonium persulfate aqueous solution or the like. The solder resist layer 60 may be formed by a method same as that for the solder resist layer 50. As necessary, a metal layer may be formed or an antioxidation process may be performed on the lower surface of the wiring layer 10 that is exposed in the open portion 60x. As described above, the pads 10a of the wiring layer 10 that are adjacent from each other are provided with a space of about a few μm to some tens of μm. Thus, in this embodiment, as an example, the single open portion 60x that exposes the lower surfaces of all of the pads 10a, respectively, of the wiring layer 10 is provided in the solder resist layer 60.

After the step illustrated in FIG. 3C, the structure body illustrated in FIG. 3C is cut at cut positions C by a slicer or the like to be individualized, and a plurality of the wiring boards 1 are completed (see FIG. 1A and FIG. 1B). As necessary, terminals for external connection such as solder balls may be provided, or an electronic component such as a chip capacitor may be mounted on the wiring layer 40 exposed in each of the open portions 50x of the solder resist layer 50, or on the wiring layer 10 exposed in the open portion 60x of the solder resist layer 60. Further, the terminals for external connection may be provided or the electronic component may be mounted on the structure body before being cut, and thereafter, the structure body may be cut to be individualized.

As such, according to the wiring board 1 of the first embodiment, the outermost wiring layer 10 is embedded in the first insulating film 21 composed of only resin and whose melt viscosity is relatively low. Thus, even when the wiring density of the wiring layer 10 is high, or the ratio of copper of the wiring layer 10 is high, voids are difficult to be generated due to insufficient filling of the insulating resin, and further, the wiring layer 10 does not contact the reinforcing member. As a result, insulation reliability of the wiring board 1 can be improved.

Further, the insulating layer 20 is a stacked structure of two layers, the first insulating film 21 composed of only resin and the second insulating film 22 including the reinforcing member 30. Thus, strength of the insulating layer 20 in total is the same as the conventional prepreg, and strength of the wiring board 1 can be retained.

Further, if a wiring layer is embedded using an insulating film including a reinforcing member as conventionally, as an amount of resin included in the insulating film including the reinforcing member is less, an upper surface of the insulating film tends to be uneven, and it is difficult to form another wiring layer on the upper surface of the insulating film. On the other hand, in this embodiment, the second insulating film 22 including the reinforcing member is formed on the first insulating film 21, and the resin of the second insulating film 22 is not used to embed the wiring layer 10. Thus, the upper surface of the second insulating film 22 becomes a flat surface. Therefore, the wiring layer 40 can be easily formed on the upper surface of the second insulating film 22.

Further, as characteristics of the first insulating film 21 and the second insulating film 22 can be arbitrarily set, design freedom can be improved. For example, it is possible to select resin that has good adhesion with the wiring layer 10, resin that has good insulating property (with high migration resistance), or resin whose melt viscosity is particularly low for the first insulating film 21. Such resin can contribute to improve insulation reliability of the wiring board 1. Alternatively, as it is possible to individually adjust CTE of each of the first insulating film 21 and the second insulating film 22 by the filler content or the like, it is possible to easily lower warping of the wiring board 1 in total.

Further, in this embodiment, not only the side surface of the wiring layer 10, but also the upper surface of the wiring layer 10 is covered by the first insulating film 21 composed of only resin. Thus, there is a sufficient distance between the wiring layer 10 and the reinforcing member 30 in the second insulating film 22. Thus, in particular, insulation reliability when moisture is absorbed can be improved.

Figure 4:
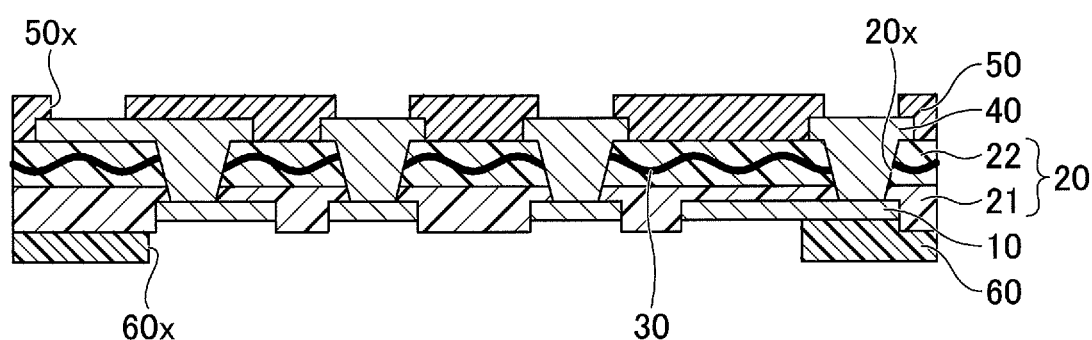
FIG. 4 is a view illustrating another example of the wiring board of the first embodiment.

When the support body 300 and the wiring layer 10 are made of the same metal (copper or the like, for example), the lower surface of the wiring layer 10 may be etched when removing the support body 300 in the step of FIG. 3C, and the lower surface of the wiring layer 10 may be concaved from the lower surface of the first insulating film 21. FIG. 4 illustrates a structure of a wiring board 1A in such a case. The wiring board 1A has the same performance as the wiring board 1.

Further, the manufacturing steps of the wiring board 1 may be altered as follows. For example, in the step of FIG. 2C, the second insulating film 22 may be formed by stacking a prepreg including a copper foil on the upper surface of the first insulating film 21. In such a case, the copper foil is stacked on the entirety of one surface of the prepreg, and the prepreg including the copper foil is stacked on the upper surface of the first insulating film 21 such that the copper foil is positioned at the upper surface. Alternatively, the second insulating film 22 may be formed by stacking a copper foil in addition to the prepreg on the upper surface of the first insulating film 21.

As a result, in FIG. 2C, the first insulating film 21, the second insulating film 22 and the copper foil are stacked in this order. Thereafter, in the step of FIG. 2D, laser processing is performed onto the copper foil as well, and the open portions 20x are formed in the insulating layer 20. Next, in the step of FIG. 3A, the wiring layer 40 is formed by a semi-additive method or a subtractive method. At this time, the copper foil remains as a part of the wiring layer 40.

Further, the manufacturing steps of the wiring board 1 may be altered as follows. For example, in the step of FIG. 2C, the second insulating film 22 may be formed by stacking a prepreg with a copper foil including a primer layer on the upper surface of the first insulating film 21.

As a result, in FIG. 2C, the first insulating film 21, the second insulating film 22, the primer layer and the copper foil are stacked in this order. Thereafter, the copper foil is removed. Next, in the step of FIG. 2D, laser processing is performed onto the primer layer as well, and the open portions 20x are formed in the insulating layer 20. Next, after the step of FIG. 3A, the wiring layer 40 may be formed by a semi-additive method or a subtractive method. At this time, the primer layer remains as a part of the insulating layer 20. The material and the like of the primer layer may be the same as those of a third insulating film 23, which will be described later.

Alternative Example 1 of First Embodiment

In an alternative example 1 of the first embodiment, an example is described in which the upper surface of the wiring layer 10 is exposed from the first insulating film 21. Here, in the alternative example 1 of the first embodiment, components same as those already described in the above embodiments may not be repeated.

Figure 5:
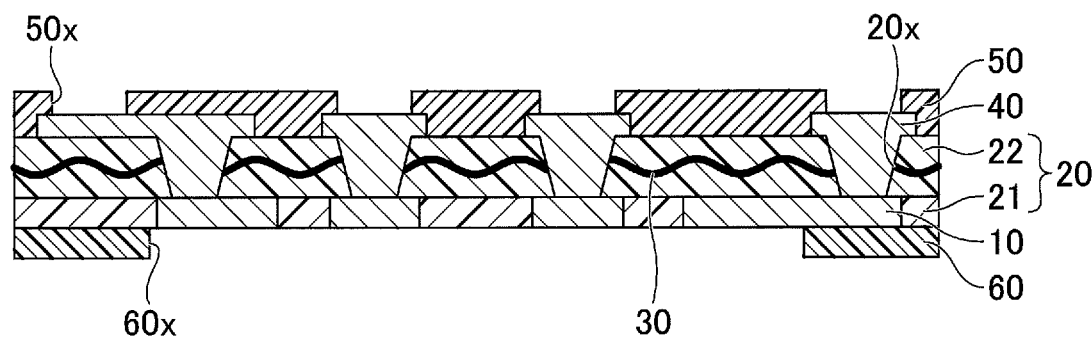
FIG. 5 is a cross-sectional view illustrating an example of a wiring board of an alternative example 1 of the first embodiment.

FIG. 5 is a cross-sectional view illustrating an example of a wiring board 1B of the alternative example 1 of the first embodiment. With reference to FIG. 5, the wiring board 1B of the alternative example 1 of the first embodiment is different from the wiring board 1 (see FIG. 1A and FIG. 1B) in that the upper surface of the wiring layer 10 is exposed from the first insulating film 21.

This means that in the wiring board 1B, the first insulating film 21 only covers the side surfaces of the wiring layer 10. The lower surface of the first insulating film 21 and the lower surface of the wiring layer 10 may be, for example, flush with each other. Further, the upper surface of the first insulating film 21 and the upper surface of the wiring layer 10 may be, for example, flush with each other. In other words, the thickness of the first insulating film 21 may be the same as the thickness of the wiring layer 10. The upper surface of the wiring layer 10 is covered by the second insulating film 22. Further, the open portions 20x are formed to penetrate only the second insulating film 22. The via wirings of the wiring layer 40 connected to the upper surface of the wiring layer 10 are formed in such open portions 20x.

Figure 6A:
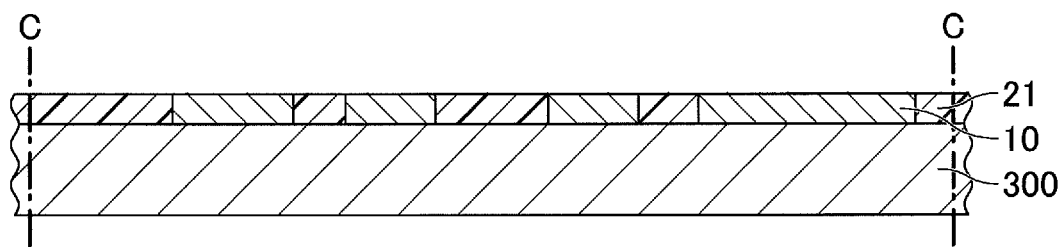
FIG. 6A to FIG. 6C are views illustrating an example of manufacturing steps of the wiring board of the alternative example 1 of the first embodiment.
Figure 6B:
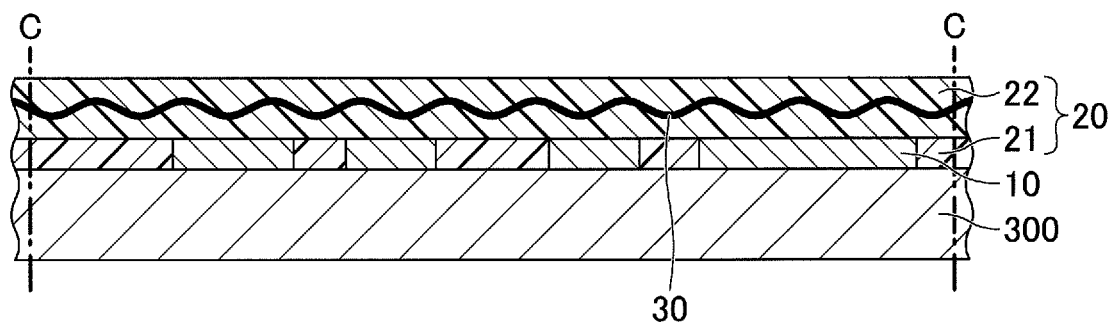
Figure 6C:
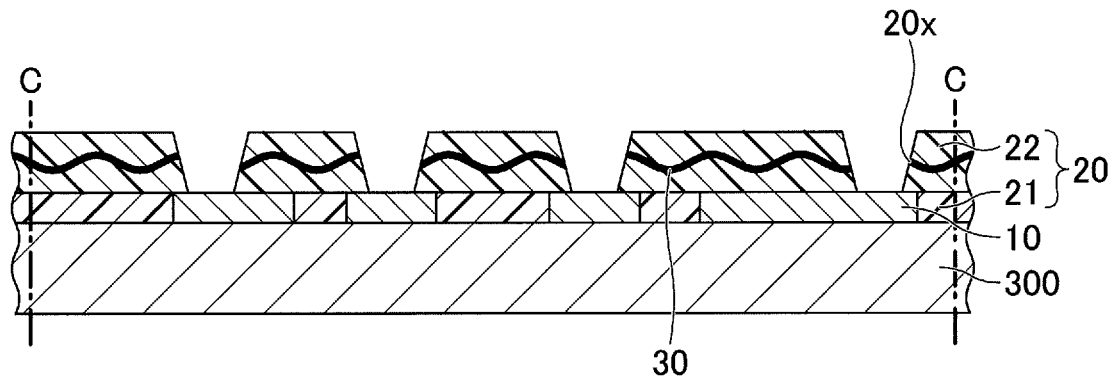

FIG. 6A to FIG. 6C are views illustrating an example of manufacturing steps of the wiring board 1B of the alternative example 1 of the first embodiment. For manufacturing the wiring board 1B, first, the steps of the first embodiment illustrated in FIG. 2A and FIG. 2B are performed, and the wiring layer 10 and the first insulating film 21 are formed on the upper surface of the support body 300. Alternatively, the wiring layer 10 and the first insulating film 21 may be formed as follows. First, epoxy-based photosensitive insulating resin is provided on the upper surface of the support body 300, for example, and the photosensitive insulating resin is patterned by exposing and developing to form open portions that expose the upper surface of the support body 300 at portions where the wiring layer 10 is to be formed. With this, the first insulating film 21 provided with the open portions is formed. Then, the wiring layer 10 is formed by electrolytic plating or the like using the support body 300 as a power supply layer to deposit electrolytic plating on the upper surface of the support body 300 that is exposed in each of the open portions of the first insulating film 21.

Thereafter, in a step illustrated in FIG. 6A, the first insulating film 21 at a semi-cured state is pressed toward the support body 300 by a plate or the like having a flat surface to make the upper surface of the first insulating film 21 and the upper surface of the wiring layer 10 flush with each other. Alternatively, a part of the first insulating film 21 that is positioned above the wiring layer 10 may be polished to make the upper surface of the first insulating film 21 and the upper surface of the wiring layer 10 flush with each other.

Next, in a step illustrated in FIG. 6B, similar to the step illustrated in FIG. 2C, the second insulating film 22 at a B-stage state (semi-cured state) is stacked on the upper surface of the first insulating film 21. Then, after stacking the second insulating film 22 on the upper surface of the first insulating film 21, the first insulating film 21 and the second insulating film 22 are heated at predetermined temperature to be cured. As necessary, the first insulating film 21 and the second insulating film 22 may be heated while being pressurized. In this step, different from the step illustrated in FIG. 2C, the upper surface of the wiring layer 10 is covered by the second insulating film 22.

Next, in a step illustrated in FIG. 6C, similar to the step illustrated in FIG. 2D, the open portions 20x that expose the upper surface of the wiring layer 10 are formed. However, in this embodiment, as the upper surface of the wiring layer 10 is covered only by the second insulating film 22, the open portions 20x are formed to penetrate only the second insulating film 22. In other words, the open portions 20x are not formed in the first insulating film 21. Thus, different from a case in which the open portions 20x are formed in both of the first insulating film 21 and the second insulating film 22, it is unnecessary to consider changing irradiation conditions of laser, adjusting conditions of the desmear process or the like, and the manufacturing steps can be simplified.

Thereafter, by performing the steps of FIG. 3A to FIG. 3C of the first embodiment, and further, individualizing the manufactured structure body by a slicer or the like, a plurality of the wiring boards 1B are completed (see FIG. 5). As necessary, terminals for external connection such as solder balls may be provided, or an electronic component such as a chip capacitor may be mounted on the wiring layer 40 exposed in each of the open portions 50x of the solder resist layer 50, or on the wiring layer 10 exposed in the open portion 60x of the solder resist layer 60. Further, the terminals for external connection may be provided or the electronic component may be mounted on the structure body before being cut, and thereafter, the structure body may be cut to be individualized.

Alternative Example 2 of First Embodiment

In an alternative example 2 of the first embodiment, an example is described in which the upper surface of the wiring layer 10 protrudes from the first insulating film 21. Here, in the alternative example 2 of the first embodiment, components same as those already described in the above embodiments may not be repeated.

Figure 7:
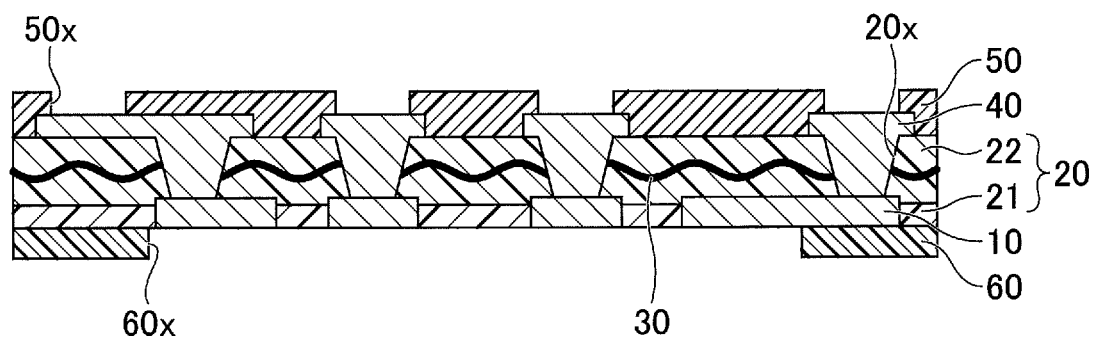
FIG. 7 is a cross-sectional view illustrating an example of a wiring board of an alternative example 2 of the first embodiment.

FIG. 7 is a cross-sectional view illustrating an example of a wiring board 1C of the alternative example 2 of the first embodiment. With reference to FIG. 7, the wiring board 1C of the alternative example 2 of the first embodiment is different from the wiring board 1 (see FIG. 1A and FIG. 1B) in that the upper surface of the wiring layer 10 is protruded from the upper surface of the first insulating film 21 into the second insulating film 22.

This means that, in the wiring board 1C, the first insulating film 21 covers only a lower side of the side surface of the wiring layer 10. The lower surface of the first insulating film 21 and the lower surface of the wiring layer 10 may be, for example, flush with each other. Further, an upper side of the side surface of the wiring layer 10 and the upper surface of the wiring layer 10 are covered by the second insulating film 22.

Figure 8:
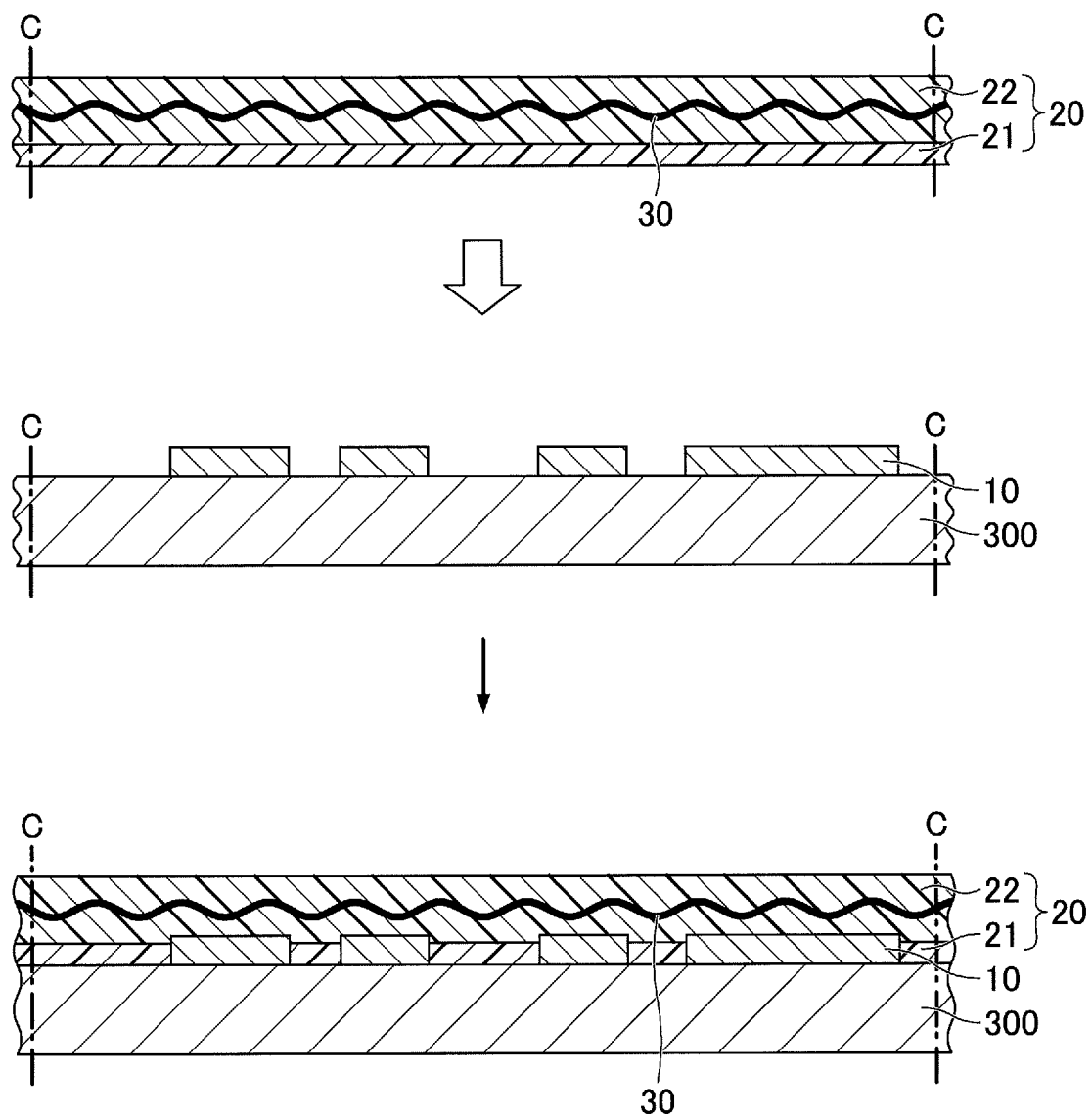
FIG. 8 is a view illustrating an example of manufacturing steps of the wiring board of the alternative example 2 of the first embodiment.

FIG. 8 is a view illustrating an example of manufacturing steps of the wiring board 1C of the alternative example 2 of the first embodiment. For manufacturing the wiring board 1C, first, a step illustrated in FIG. 8 is performed. In the step illustrated in FIG. 8, the insulating layer 20 at a B-stage state (semi-cured state) in which the first insulating film 21 and the second insulating film 22 are previously stacked is prepared. Further, in parallel to the step illustrated in FIG. 8, the step illustrated in FIG. 2A of the first embodiment is performed, and the wiring layer 10 is formed on the upper surface of the support body 300.

Then, the insulating layer 20 is laminated on the upper surface of the support body 300 while facing the first insulating film 21 to the support body 300 so as to cover the wiring layer 10, and the first insulating film 21 and the second insulating film 22 are heated at predetermined temperature to be cured. As necessary, the first insulating film 21 and the second insulating film 22 may be heated while being pressurized. By previously setting the thickness of the first insulating film 21 to be thinner than the thickness of the wiring layer 10, as illustrated at a lower side of FIG. 8, the upper surface of the wiring layer 10 is formed to protrude from the first insulating film 21. However, it is necessary to set the protruding amount of the wiring layer 10 such that the upper surface of the wiring layer 10 does not contact the reinforcing member 30.

In the steps illustrated in FIG. 8, by appropriately setting the thickness of the first insulating film 21, the wiring board having the structure of FIG. 1 or the structure of FIG. 5 may be manufactured as well. Further, depending on the thickness of the first insulating film 21, there may be a case in which the wiring board having the structure of FIG. 1, the structure of FIG. 5 and the structure of FIG. 7 are mixed may be obtained. However, even in such a case, there is no problem.

Figure 9A:
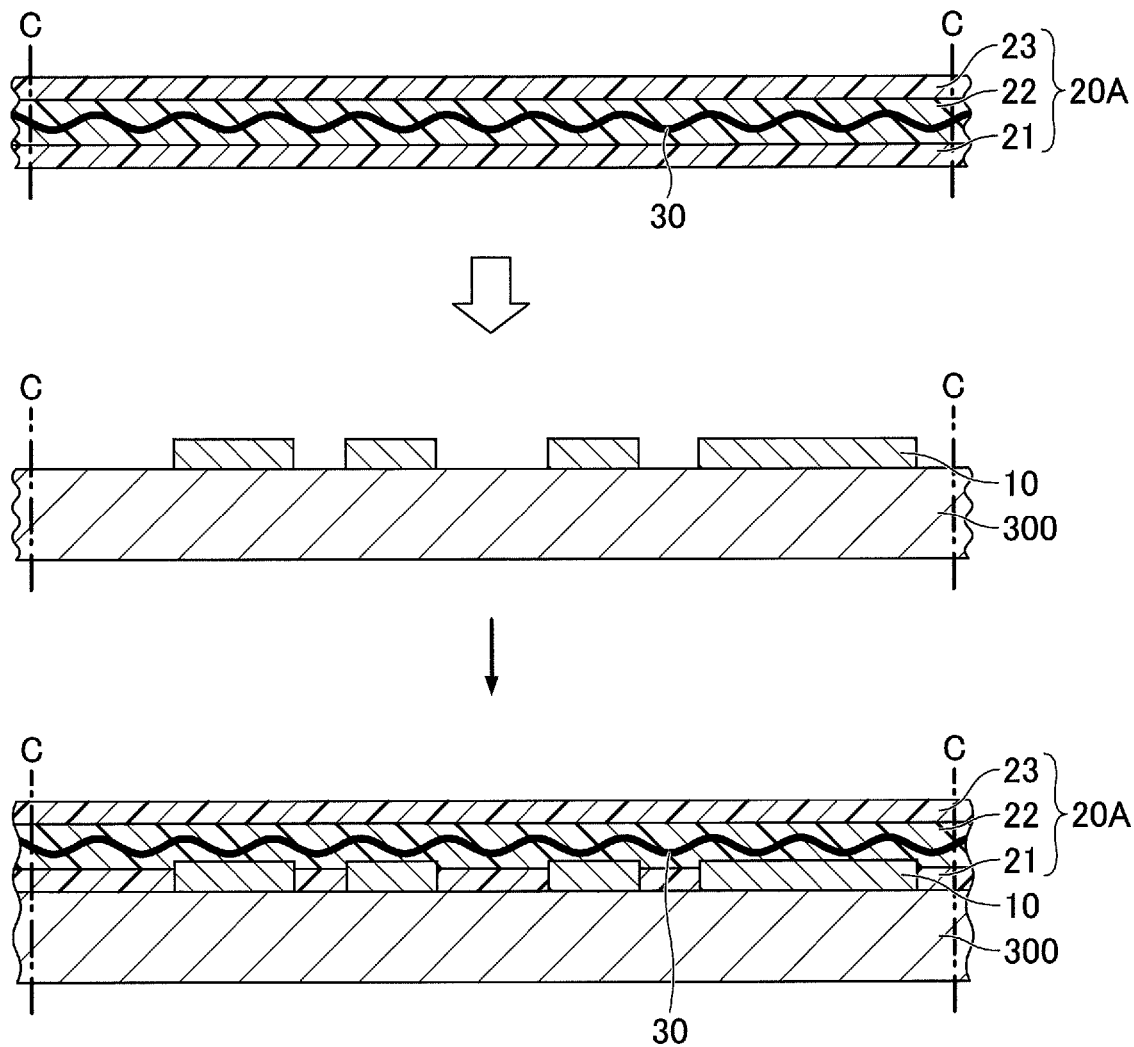
FIG. 9A and FIG. 9B are views illustrating an example of the manufacturing steps of the wiring board of the alternative example 2 of the first embodiment.

Further, instead of the insulating layer 20 of FIG. 8, an insulating layer 20A having a three-layered structure as illustrated in FIG. 9A may be used. The insulating layer 20A has a structure in which a third insulating film 23 is further stacked on the second insulating film 22 of the insulating layer 20. The third insulating film 23 is an insulating film that does not include a reinforcing member, and may be referred to as a primer layer as well.

For an insulating film such as the second insulating film 22 including the reinforcing member 30, it may be difficult to deposit electroless plating on the upper surface of the second insulating film 22 due to the existence of the reinforcing member 30. Thus, in such a case, a method of forming a wiring layer using electroless plating such as a semi-additive method cannot be used. Thus, in FIG. 9A, the third insulating film 23 is stacked on the upper surface of the second insulating film 22 so as to enable deposition of electroless plating. With this, the wiring layer can be formed by a semi-additive method, for example.

As the material of the third insulating film 23, for example, insulating resin that contains a material same as the second insulating film 22 and whose composition is adjusted such that electroless plating is easily deposited may be used. The thickness of the third insulating film 23 may be, for example, about 1 to 10 μm.

As illustrated in FIG. 9A, the insulating layer 20A is laminated on the upper surface of the support body 300 while facing the first insulating film 21 to the support body 300 so as to cover the wiring layer 10, and the first insulating film 21, the second insulating film 22 and the third insulating film 23 are heated at predetermined temperature to be cured. As necessary, the first insulating film 21, the second insulating film 22 and the third insulating film 23 may be heated while being pressurized. By previously setting the thickness of the first insulating film 21 to be thinner than the thickness of the wiring layer 10, as illustrated at a lower side of FIG. 9A, the upper surface of the wiring layer 10 may be formed to protrude from the first insulating film 21.

Figure 9B:
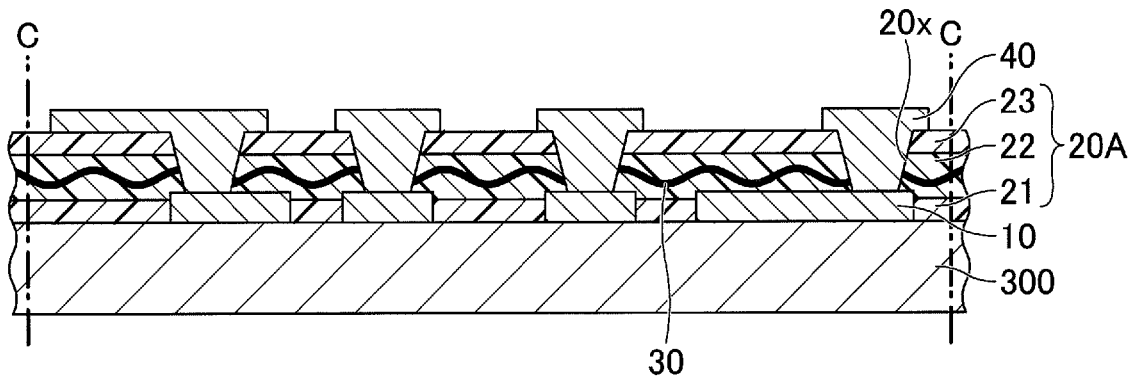

Thereafter, by performing the steps similar to those of FIG. 2D and FIG. 3A of the first embodiment, as illustrated in FIG. 9B, the wiring layer 40 can be formed. When forming the wiring layer 40 by a semi-additive method, first, a seed layer made of copper (Cu) or the like is formed on the upper surface of the wiring layer 10 exposed at the bottom portion of each of the open portions 20x and on the insulating layer 20A including an inner wall surface of each of the open portions 20x by electroless plating. Further, a resist layer provided with open portions corresponding to the wiring layer 40 is formed on the seed layer.

Then, a wiring layer made of copper (Cu) or the like is formed in the open portions of the resist layer by electrolytic plating using the seed layer as a power supply layer. Subsequently, after removing the resist layer, a portion of the seed layer that is not covered by the wiring layer is removed using the wiring layer as a mask. With this, the wiring layer 40 including the via wirings filled in the open portions 20x, respectively, and the wiring patterns formed on the insulating layer 20A (on the third insulating film 23) is formed on the insulating layer 20A.

Figure 10:
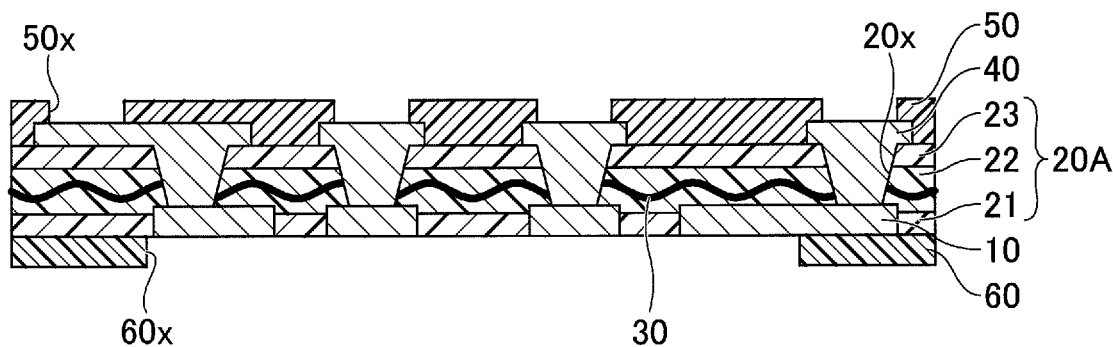
FIG. 10 is a cross-sectional view illustrating another example of the wiring board of the alternative example 2 of the first embodiment.

After the step of FIG. 9B, the steps illustrated in FIG. 3B and FIG. 3C of the first embodiment are performed, and further, individualizing the manufactured structure body by a slicer or the like, a plurality of a wiring board 1D illustrated in FIG. 10 are completed. As necessary, terminals for external connection such as solder balls may be provided, or an electronic component such as a chip capacitor may be mounted on the wiring layer 40 exposed in each of the open portions 50x of the solder resist layer 50, or on the wiring layer 10 exposed in the open portion 60x of the solder resist layer 60. Further, the terminals for external connection may be provided or the electronic component may be mounted on the structure body before being cut, and thereafter, the structure body may be cut to be individualized.

In the different embodiments as well, the wiring layer may be formed by a semi-additive method by stacking the third insulating film 23 on the second insulating film 22. In other words, for the wiring board 1 illustrated in FIG. 1A, the wiring board 1A illustrated in FIG. 4, the wiring board 1B illustrated in FIG. 5, or a wiring board 1E illustrated in FIG. 11, which will be described later, the insulating layer 20A may be used instead of the insulating layer 20.

Second Embodiment

In a second embodiment, an example of a wiring board having a three-layered structure is described. In the second embodiment, components same as those already described in the above embodiments may not be repeated.

Figure 11:
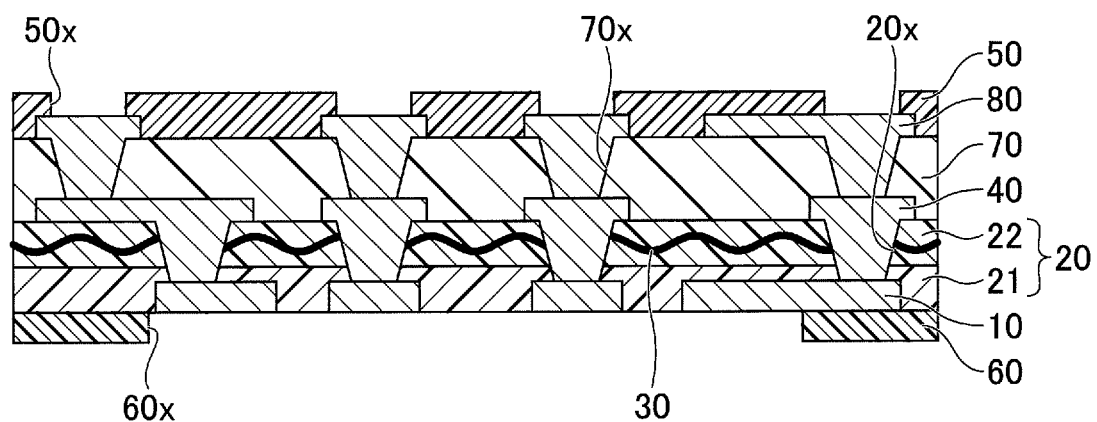
FIG. 11 is a cross-sectional view illustrating an example of a wiring board of the second embodiment.

FIG. 11 is a cross-sectional view illustrating an example of the wiring board 1E of the second embodiment. With reference to FIG. 11, the wiring board 1E of the second embodiment is different from the wiring board 1 (see FIG. 1A and FIG. 1B) in that an insulating layer 70 and a wiring layer 80 are inserted between the wiring layer 40 and the solder resist layer 50.

The insulating layer 70 is formed on the upper surface of the insulating layer 20 so as to cover the wiring layer 40. As the material of the insulating layer 70, for example, epoxy-based insulating resin or the like may be used. The insulating layer 70 may include filler such as silica ($SiO_2$). The thickness of the insulating layer 70 may be, for example, about 15 to 35 μm.

Here, a stacked body including the first insulating film 21 and the second insulating film 22 may be used as the insulating layer 70. In this case, the insulating layer 70, which is the stacked body of the first insulating film 21 and the second insulating film 22, is stacked on the insulating layer 20, which is the stacked body of the first insulating film 21 and the second insulating film 22. Alternatively, the insulating layer 70 may include a reinforcing member. In this case, as the materials of insulating resin and the reinforcing member composing the insulating layer 70, those same as the second insulating film 22 and the reinforcing member 30 may be used.

The wiring layer 80, which is a third wiring layer, is formed on the insulating layer 70. The wiring layer 80 includes via wirings filled in via holes 70x that penetrate the insulating layer 70 to expose the upper surface of the wiring layer 40, respectively, and wiring patterns formed on an upper surface of the insulating layer 70. Each of the via holes 70x is a concave portion having an inverse cone trapezoid shape where the diameter of a portion open at the solder resist layer 50 side is larger than the diameter of a bottom portion of the respective via hole 70x formed at the upper surface of the wiring layer 40.

The wiring layer 80 is electrically connected to the wiring layer 40 that is exposed at a bottom portion of each of the via holes 70x. As the material of the wiring layer 80, for example, copper (Cu) or the like may be used. The thickness of the wiring pattern composing the wiring layer 80 may be, for example, about 1 to 35 μm.

The solder resist layer 50 is formed on the upper surface of the insulating layer 70 so as to cover the wiring layer 80. The solder resist layer 50 is provided with the open portions 50x, and a part of the wiring layer 80 is exposed at the bottom portion of each of the open portions 50x. The wiring layer 80 exposed at the bottom portion of each of the open portions 50x functions as pads that are electrically connected to another wiring board, a semiconductor package, a semiconductor chip or the like. The material and the thickness of the solder resist layer 50 are as described above.

Figure 12A:
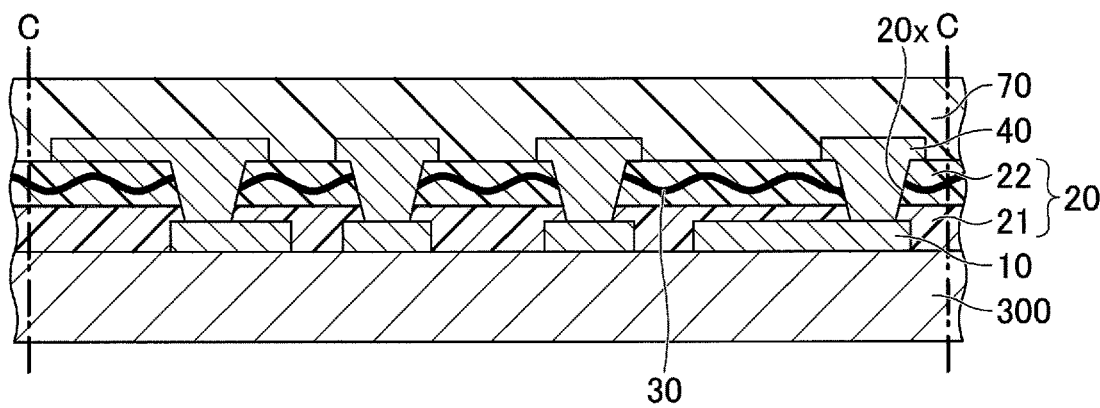
FIG. 12A to FIG. 12C are views illustrating an example of manufacturing steps of the wiring board of the second embodiment.
Figure 12B:
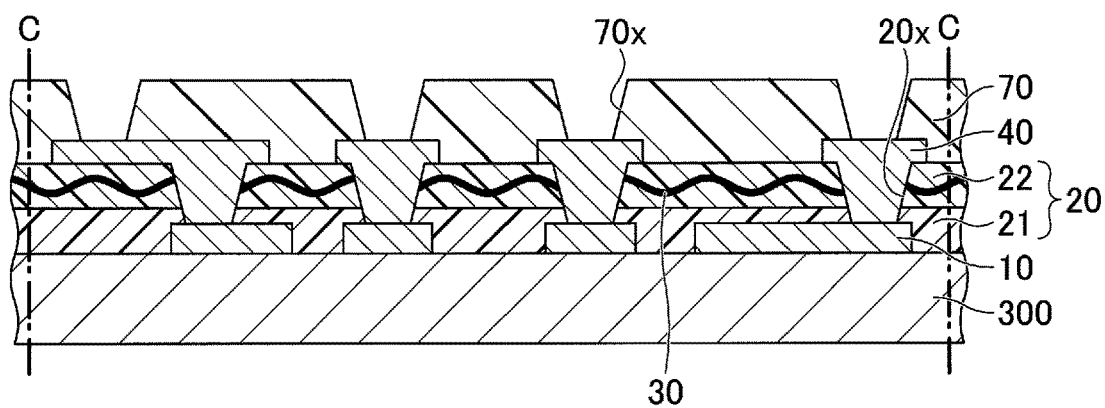
Figure 12C:
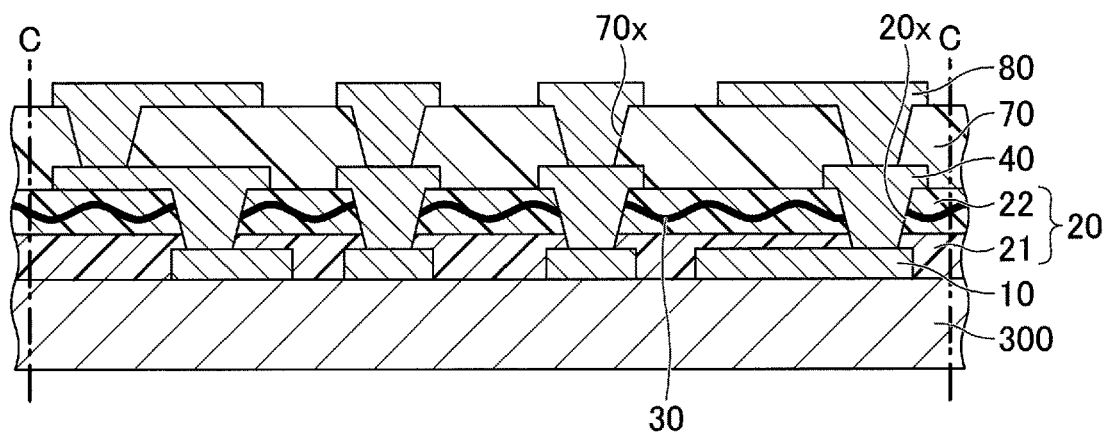

FIG. 12A to FIG. 12C are views illustrating an example of manufacturing steps of the wiring board 1E. For manufacturing the wiring board 1E, first, the steps illustrated in FIG. 2A to FIG. 3A of the first embodiment are performed. Thereafter, in a step illustrated in FIG. 12A, a thermosetting epoxy-based insulating resin film, for example, is laminated on the insulating layer 20 so as to cover the wiring layer 40. Alternatively, thermosetting liquid or paste epoxy-based insulating resin or the like is coated on the insulating layer 20 by screen printing, spin coating or the like, for example, so as to cover the wiring layer 40. Then, while pressing the laminated or coated insulating resin, the laminated or coated insulating resin is heated to greater than or equal to curing temperature to be cured to manufacture the insulating layer 70. As necessary, the insulating resin may be heated while being pressurized.

Next, in a step illustrated in FIG. 12B, similar to the step illustrated in FIG. 2D of the first embodiment, the via holes 70x each penetrating the insulating layer 70 to expose the upper surface of the wiring layer 40 are formed in the insulating layer 70. When the via holes 70x are formed by laser processing, it is preferable that resin residue of the insulating layer 70 adhered on the upper surface of the wiring layer 40 exposed at the bottom portion of each of the open portions 70x is removed by performing a desmear process.

Next, in a step illustrated in FIG. 12C, similar to the step illustrated in FIG. 3A of the first embodiment, the wiring layer 80 is formed on the insulating layer 70. Thereafter, by performing the steps illustrated in FIG. 3B and FIG. 3C of the first embodiment, and further, individualizing the manufactured structure body by a slicer or the like, a plurality of the wiring boards 1E (see FIG. 11) are completed. As necessary, terminals for external connection such as solder balls may be provided, or an electronic component such as a chip capacitor may be mounted on the wiring layer 80 exposed in each of the open portions 50x of the solder resist layer 50, or on the wiring layer 10 exposed in the open portion 60x of the solder resist layer 60. Further, the terminals for external connection may be provided or the electronic component may be mounted on the structure body before being cut, and thereafter, the structure body may be cut to be individualized.

As such, by stacking the insulating layer 70 and the wiring layer 80 on the wiring layer 40, the wiring board 1E having the three-layered structure can be actualized. It is possible to alternately stack a necessary number of insulating layers and the wiring layers on the wiring layer 40 to obtain a wiring board of four or more layered structure. At this time, it is preferable to use a stacked body including the first insulating film 21 and the second insulating film 22 as one or more of the insulating layers stacked on the wiring layer 40 to further improve insulation reliability.

Applied Example 1 of Wiring Board

In an applied example 1 of the wiring board, a semiconductor package in which a semiconductor chip is mounted (flip-chip mounted) on the wiring board of the first embodiment and the second embodiment is described. In the applied example 1 of the wiring board, components same as those already described in the above embodiments may not be repeated.

Figure 13A:
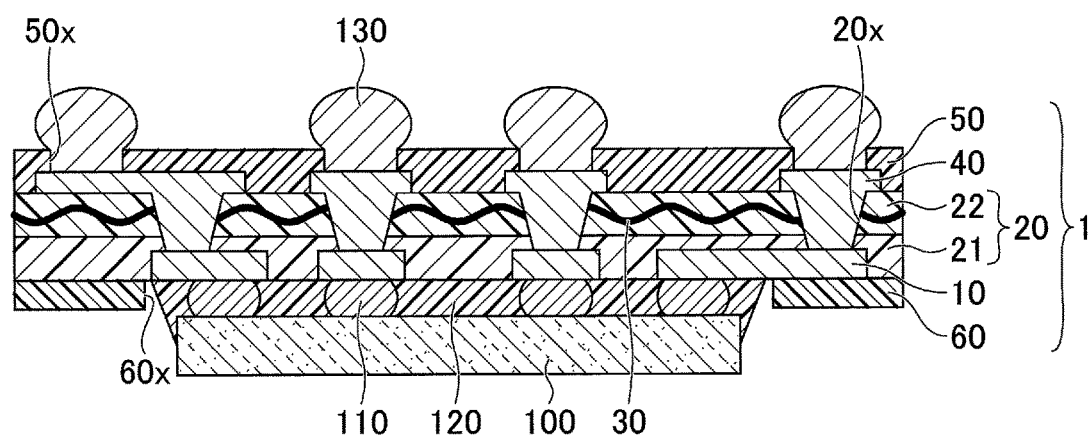
FIG. 13A and FIG. 13B are cross-sectional views illustrating an example of a semiconductor package of an applied example 1.
Figure 13B:
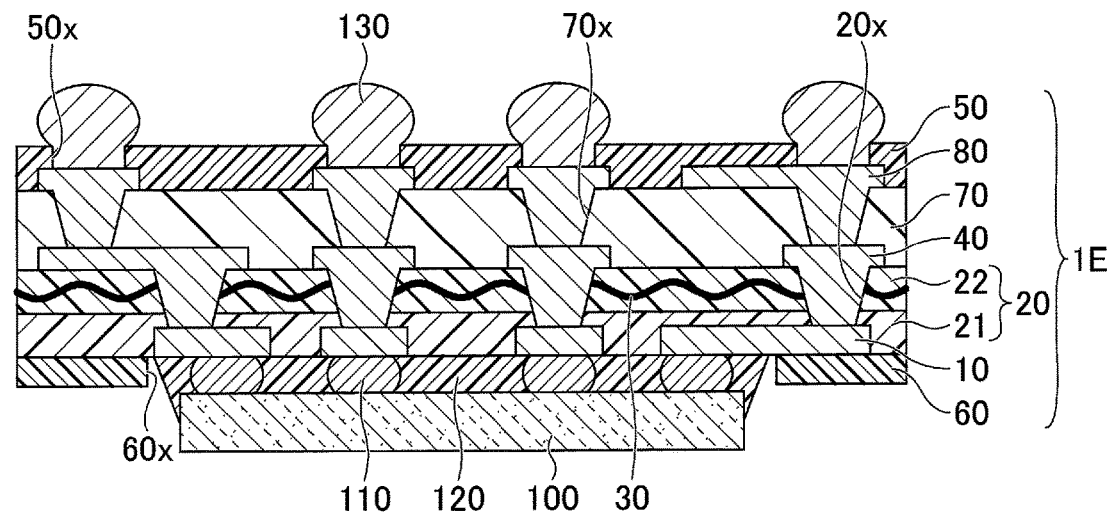

FIG. 13A and FIG. 13B are cross-sectional views illustrating an example of semiconductor packages 5 and 5A of the applied example 1, respectively. With reference to FIG. 13A, the semiconductor package 5 includes the wiring board 1 illustrated in FIG. 1, a semiconductor chip 100, bumps 110, underfill resin 120 and bumps 130. In the semiconductor package 5, a first insulating film 21 side of the wiring board 1 is a chip mounting surface on which the semiconductor chip 100 is mounted, and a solder resist layer 50 side of the wiring board 1 is an external connection terminal surface on which the terminals for external connection are formed.

The semiconductor chip 100 has a structure, for example, in which a semiconductor integrated circuit (not illustrated in the drawings) or the like is formed on a semiconductor substrate (not illustrated in the drawings) which is a thinned substrate made of silicon or the like. Electrode pads (not illustrated in the drawings) that are electrically connected to the semiconductor integrated circuit (not illustrated in the drawings) are formed on the semiconductor substrate (not illustrated in the drawings).

Each of the bumps 110 electrically connects the respective electrode pad (not illustrated in the drawings) of the semiconductor chip 100 and the wiring layer 10 exposed in the open portion 60x of the solder resist layer 60 of the wiring board 1. The underfill resin 120 is filled between the semiconductor chip 100 and the wiring board 1 (first insulating film 21). The bumps 130 are terminals for external connection formed on the upper surface of the wiring layer 40 exposed at the bottom portion of each of the open portions 50x of the solder resist layer 50. The bumps 130 are, for example, electrically connected to another wiring board (a motherboard or the like), another semiconductor package or the like. The bumps 110 and 130 are, for example, solder bumps. As the material of the solder bump, for example, an alloy containing Pb, an alloy of Sn and Cu, an alloy of Sn and Ag, an alloy of Sn, Ag and Cu or the like may be used.

As such, by mounting the semiconductor chip 100 on the wiring board 1 of the first embodiment, the semiconductor package 5 can be actualized. Further, as a semiconductor package 5A illustrated in FIG. 13B, by mounting the semiconductor chip 100 on the wiring board 1E of the second embodiment, the semiconductor package 5A can be actualized. It is of course possible to use the wiring board 1A, 1B, 1C or 1D instead of the wiring board 1 or 1E.

By selecting resin that is compatible with the underfill resin 120 for the first insulating film 21, it is easy to fill the underfill resin 120.

Although an example is described in which the semiconductor chip 100 is mounted at the wiring layer 10 side, and the bumps 130 are provided on the wiring layer 40 or 80 is illustrated in FIG. 13A and FIG. 13B, the semiconductor chip 100 may be mounted at the wiring layer 40 or 80 side, and the bumps 130 may be formed on the wiring layer 10.

Applied Example 2 of Wiring Board

In an applied example 2 of the wiring board, an example of a semiconductor package having a so-called POP (Package on package) structure in which another semiconductor package is mounted on a semiconductor package is described. In the applied example 2 of the wiring board, components same as those already described in the above embodiments may not be repeated.

Figure 14:
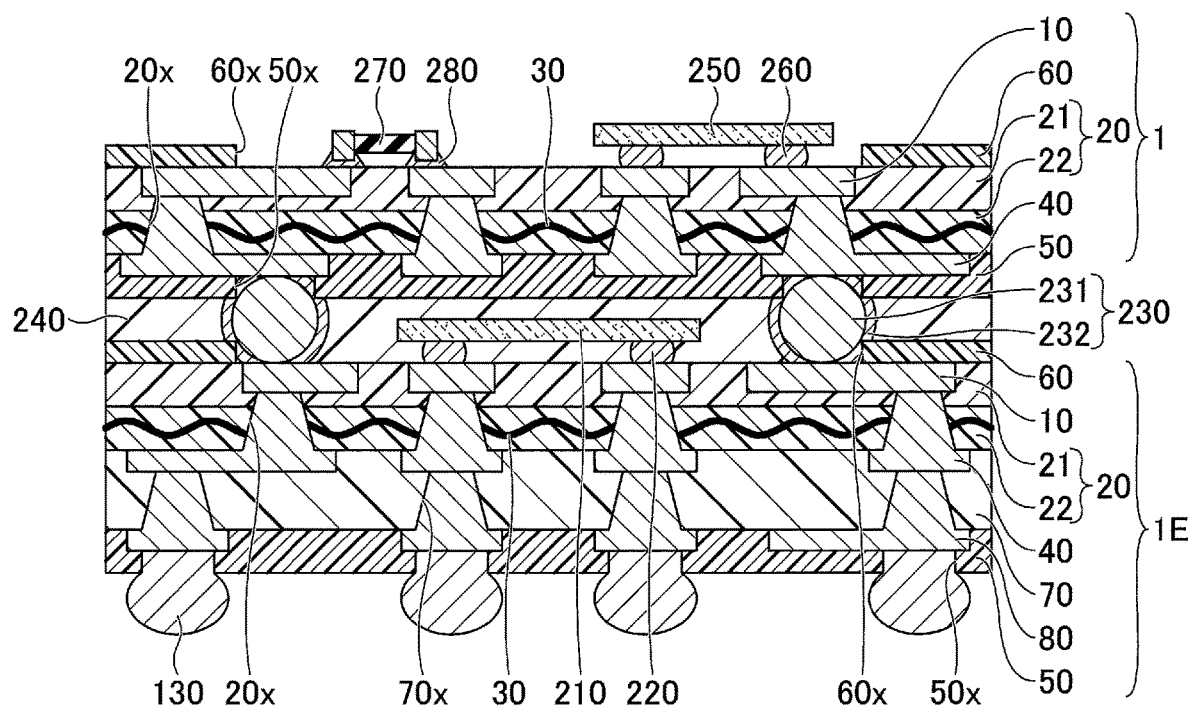
FIG. 14 is a cross-sectional view illustrating an example of a semiconductor package of an applied example 2.

FIG. 14 is a cross-sectional view illustrating an example of semiconductor package 5B of the applied example 2. With reference to FIG. 14, the semiconductor package 5B has a structure in which a second semiconductor package including the wiring board 1 is mounted on a first semiconductor package including the wiring board 1E.

In the first semiconductor package, a semiconductor chip 210 is mounted on the insulating layer 20 side of the wiring board 1E through bumps 220, and the bumps 130 are formed on the wiring layer 80 exposed from each of the open portions 50x of the solder resist layer 50. Further, in the second semiconductor package, a semiconductor chip 250 and a chip capacitor 270 are mounted on the insulating layer 20 side of the wiring board 1 through bumps 260 and solder 280, respectively.

The first semiconductor package and the second semiconductor package are connected through solder balls 230 each having a structure in which a copper core ball 231 is surrounded by solder 232. More detail, the wiring layer 10 of the wiring board 1E composing the first semiconductor package, and the wiring layer 40 of the wiring board 1 composing the second semiconductor package are connected through the solder balls 230.

The solder balls 230 function as a spacer that keeps a distance between the first semiconductor package and the second semiconductor package to be a prescribed value in addition to function as a bonding material that connects (bonds) the first semiconductor package and the second semiconductor package. This means that the solder 232 functions as the bonding material, and the copper core ball 231 functions as the spacer. Here, the height of each of the solder balls 230 is set to be larger than a total of the thickness of the semiconductor chip 210 and the thickness of each of the bumps 220.

Sealing resin 240 is filled in a space between the wiring board 1 and the wiring board 1E. By filling the sealing resin 240, the wiring board 1 can be fixed to the wiring board 1E and the semiconductor chip 210 mounted on the wiring board 1E is sealed. This means that the sealing resin 240 functions as an adhesive agent for adhering the first semiconductor package and second semiconductor package, and also functions as a protective layer for protecting the semiconductor chip 210. Further, by providing the sealing resin 240, mechanical strength of the entirety of the semiconductor package 5B can be increased.

As such, by using the wiring board 1 of the first embodiment and the wiring board 1E of the second embodiment, the semiconductor package 5B having a POP structure in which an active component (the semiconductor chip 210 and the like) and/or a passive component (the chip capacitor 270) is mounted can be actualized. It is of course possible to use the wiring board 1A, 1B, 1C or 1D instead of the wiring board 1 or 1E.

Third Embodiment

In a third embodiment, an example of a wiring board including fine wirings is described. Here, in the third embodiment, components same as those already described in the above embodiments may not be repeated.

Structure of Wiring Board of Third Embodiment

Figure 15:
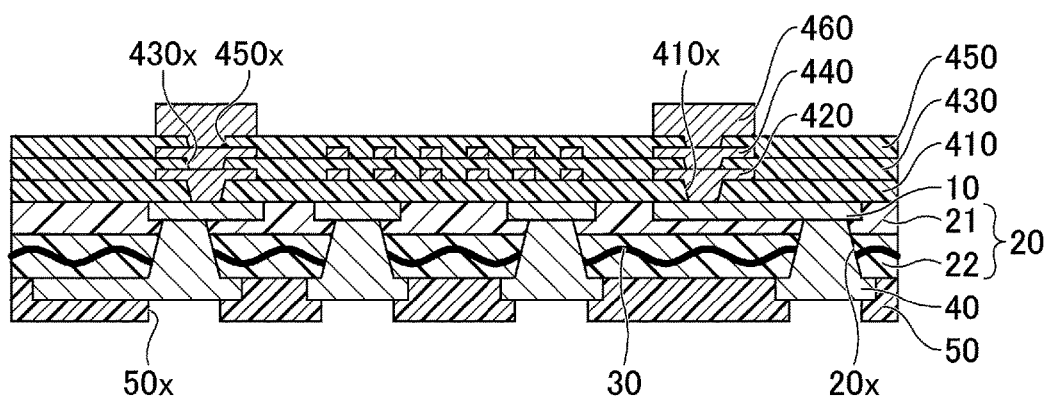
FIG. 15 is a cross-sectional view illustrating an example of a wiring board of a third embodiment.

First, a structure of the wiring board of the third embodiment is described. FIG. 15 is a cross-sectional view illustrating an example of a wiring board 1F of the third embodiment. With reference to FIG. 15, the wiring board 1F of the third embodiment has a structure in which an insulating layer 410, a wiring layer 420, an insulating layer 430, a wiring layer 440, an insulating layer 450 and a wiring layer 460 are stacked in this order on the insulating layer 20 of the wiring board 1 (see FIG. 1A and FIG. 1B). Here, the wiring layer 10, the insulating layer 20 and the like are illustrated in a reversed state in FIG. 15 compared with FIG. 1.

Each of the insulating layers 410, 430 and 450 is formed to be thinner than the insulating layer 20. Further, wiring patterns composing each of the wiring layers 420 and 440 is formed to be thinner than the wiring patterns composing each of the wiring layers 10 and 40. Density of the wiring patterns of each of the wiring layers 420 and 440 is higher than that of the wiring patterns of each of the wiring layers 10 and 40. In other words, the wiring patterns of each of the wiring layers 420 and 440 are fine wirings compared with those of each of the wiring layers 10 and 40. A solder resist layer that exposes pads of the wiring layer 460 may be provided on the insulating layer 450.

In the wiring board 1F, the other surface of the wiring layer 10 and the other surface of the insulating layer 20 (the other surface of the first insulating film 21) are polished to be a flat surface. The insulating layer 410 is formed on the flat surface formed by the other surface of the wiring layer 10 and the other surface of the insulating layer 20. As the material of the insulating layer 410, for example, photosensitive insulating resin (thermosetting) whose main constituent is epoxy-based resin, phenol-based resin or the like may be used. The insulating layer 410 may include filler such as silica ($SiO_2$). The thickness of the insulating layer 410 may be, for example, about 3 to 30 μm.

The wiring layer 420 is formed on the other surface of the insulating layer 410. The wiring layer 420 includes via wirings filled in via holes 410x, respectively, and wiring patterns formed on the other surface of the insulating layer 410. Each of the via holes 410x is a concave portion having an inverse cone trapezoid shape where the diameter of a portion open at the insulating layer 430 is larger than the diameter of a bottom portion of the respective via hole 410x formed at the other surface of the wiring layer 10. The wiring layer 420 is electrically connected to the wiring layer 10 through the via holes 410x. As the material of the wiring layer 420, for example, copper (Cu) or the like may be used. The thickness of the wiring pattern composing the wiring layer 420 may be, for example, about 1 to 3 μm.

The insulating layer 430 is formed on the other surface of the insulating layer 410 so as to cover the wiring layer 420. The material and the thickness of the insulating layer 430 may be, for example, the same as those of the insulating layer 410.

The wiring layer 440 is formed on the other surface of the insulating layer 430. The wiring layer 440 includes via wirings filled in via holes 430x, respectively, and wiring patterns formed on the other surface of the insulating layer 430. Each of the via holes 430x is a concave portion having an inverse cone trapezoid shape where the diameter of a portion open at the insulating layer 450 is larger than the diameter of a bottom portion of the respective via hole 430x formed at the other surface of the wiring layer 420. The wiring layer 440 is electrically connected to the wiring layer 420 through the via holes 430x. The material of the wiring layer 440 and the thickness of the wiring pattern composing the wiring layer 440 may be, for example, the same as those of the wiring layer 420.

The insulating layer 450 is formed on the other surface of the insulating layer 430 so as to cover the wiring layer 440. The material and the thickness of the insulating layer 450 may be, for example, the same as those of the insulating layer 410.

The wiring layer 460 is formed on the other surface of the insulating layer 450. The wiring layer 460 includes via wirings filled in via holes 450x, respectively, and pads (posts) that are protruded from the other surface of the insulating layer 450. Each of the via holes 450x is a concave portion having an inverse cone trapezoid shape where the diameter of a portion open at an external side of the wiring board 1F is larger than the diameter of a bottom portion of the respective via hole 450x formed at the other surface of the wiring layer 440. The wiring layer 460 is electrically connected to the wiring layer 440 through the via holes 450x.

The material of the wiring layer 460 may be, for example, similar to that of the wiring layer 420. The thickness of the wiring layer 460 (including the pad portion that protrudes from the other surface of the insulating layer 450) may be, for example, about 10 μm. A planar shape of each of the pads of the wiring layer 460 may be, for example, a circular shape whose diameter is about 20 to 30 μm. A pitch of the pads of the wiring layer 460 may be, for example, about 40 to 50 μm. The pads of the wiring layer 460 function as pads that are electrically connected to a semiconductor chip or the like. The above described metal layer may be formed or the antioxidation process may be performed on the surface (only the upper surface, or the upper surface and the side surface) of each of the pads of the wiring layer 460.

Method of Manufacturing Wiring Board of Third Embodiment

Next, a method of manufacturing the wiring board 1F of the third embodiment is described. FIG. 16A to FIG. 17C are views illustrating an example of manufacturing steps of the wiring board 1F of the third embodiment. In this embodiment, an example of manufacturing steps is described in which parts corresponding to the plurality of the wiring boards are manufactured on a support body, and after removing the support body, the plurality of wiring boards are manufactured by individualizing the parts. Alternatively, as another example of manufacturing steps, a single wiring board may be manufactured on a support body and the support body may be removed to obtain the wiring board.

Figure 16A:
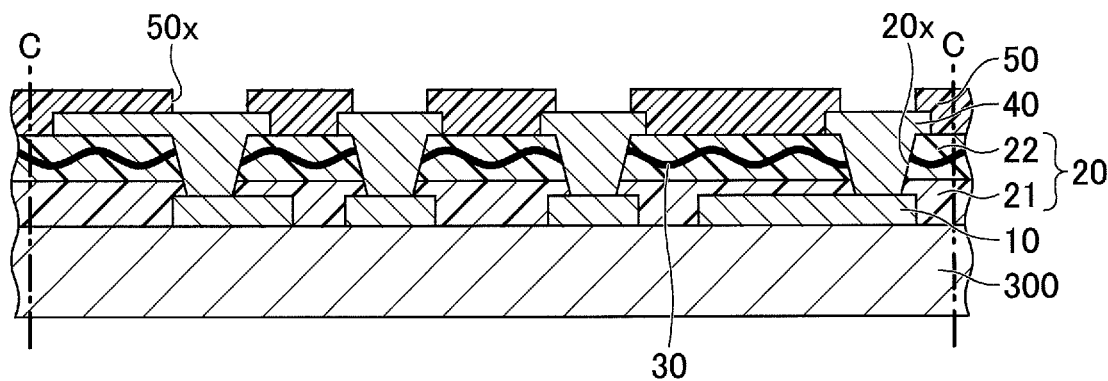
FIG. 16A to FIG. 16C are views illustrating an example of manufacturing steps of the wiring board of the third embodiment.

First, in a step illustrated in FIG. 16A, by performing the steps similar to those of FIG. 2A to FIG. 3B, the wiring layer 10, the insulating layer 20, the wiring layer 40 and the solder resist layer 50 are formed on the support body 300.

Figure 16B:
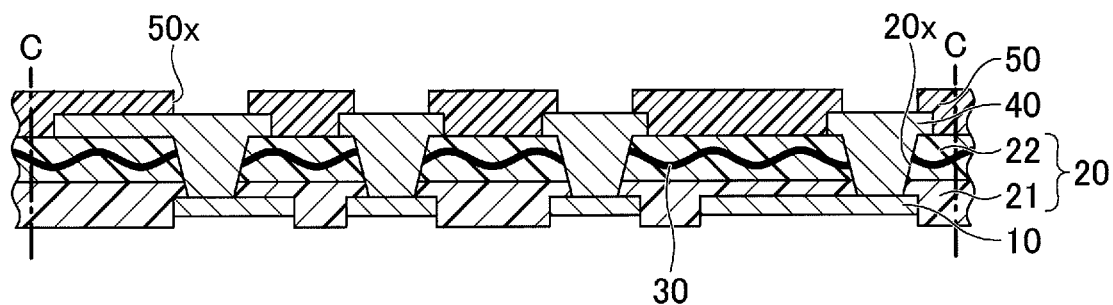

Next, in a step illustrated in FIG. 16B, similar to the step illustrated in FIG. 3C, the support body 300 illustrated in FIG. 16A is removed. When the support body 300 and the wiring layer 10 are made of the same metal (copper or the like, for example), the other surface of the wiring layer 10 is also etched and the other surface of the wiring layer 10 is concaved from the other surface of the first insulating film 21.

Figure 16C:
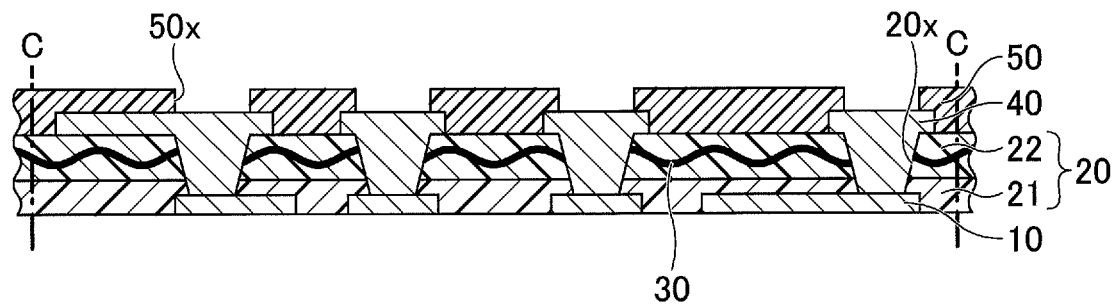

Next, in a step illustrated in FIG. 16C, the other surface of the insulating layer 20 (the other surface of the first insulating film 21) of the structure body illustrated in FIG. 16B is polished using a CMP method (chemical mechanical polishing method) or the like. At this time, a part of the other surface of the wiring layer 10 may be polished at the same time. With this, the other surface of the wiring layer 10 and the other surface of the insulating layer 20 forms a flat surface (flush with each other). As the first insulating film 21 of the insulating layer 20 is composed of only insulating resin and does not include a reinforcing member such as a glass cloth, the reinforcing member such as the glass cloth does not protrude from the surface and it is easy to make the surface flat.

Figure 17A:
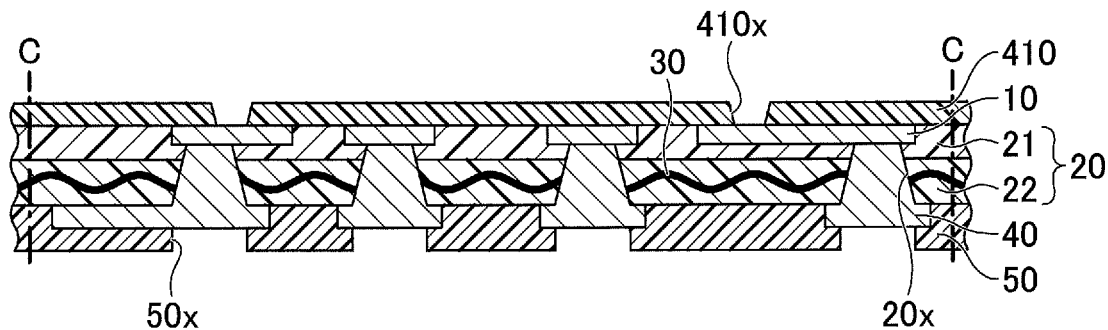
FIG. 17A to FIG. 17C are views illustrating an example of the manufacturing steps of the wiring board of the third embodiment.

Next, in a step illustrated in FIG. 17A, the insulating layer 410 is formed on the flat surface formed by the other surface of the wiring layer 10 and the other surface of the insulating layer 20. Then, the via holes 410x that penetrate the insulating layer 410 to expose the other surface of the wiring layer 10 are formed in the insulating layer 410. As the material of the insulating layer 410, for example, photosensitive insulating resin (thermosetting) whose main constituent is epoxy-based resin, phenol-based resin or the like may be used.

Specifically, for example, liquid or paste insulating resin is coated on the flat surface formed by the other surface of the wiring layer 10 and the other surface of the insulating layer 20 by spin coating or the like, and heated to be cured to form the insulating layer 410. Then, by exposing and developing the insulating layer 410, the via holes 410x are formed (photolithography). As such, as the via holes 410x can be formed by photolithography, it is preferable to use photosensitive insulating resin as the material of the insulating layer 410 to form fine wirings. The structure is illustrated in a reversed state in FIG. 17A to FIG. 17C compared with FIG. 16A to FIG. 16C.

Figure 17B:
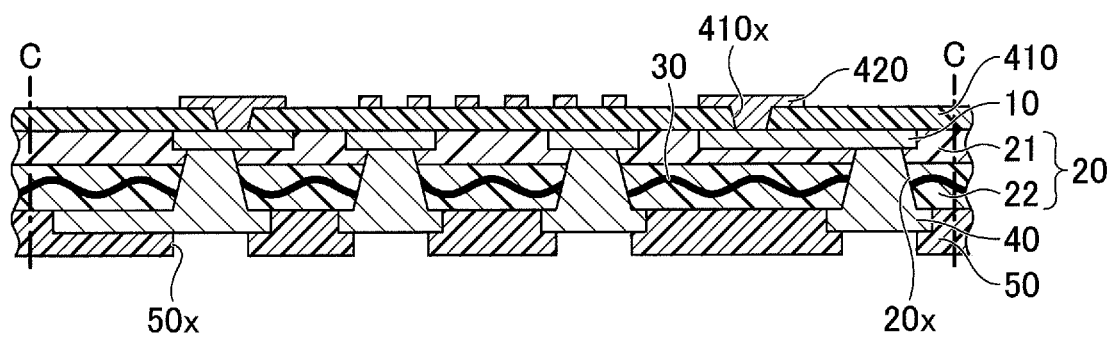

Next, in a step illustrated in FIG. 17B, the wiring layer 420 is formed on the other surface of the insulating layer 410 by a semi-additive method or the like, for example. Next, in a step illustrated in FIG. 17C, by repeating the steps illustrated in FIG. 17A and FIG. 17B, the insulating layer 430, the wiring layer 440, the insulating layer 450 and the wiring layer 460 are stacked on the other surface of the insulating layer 410 in this order.

Figure 17C:
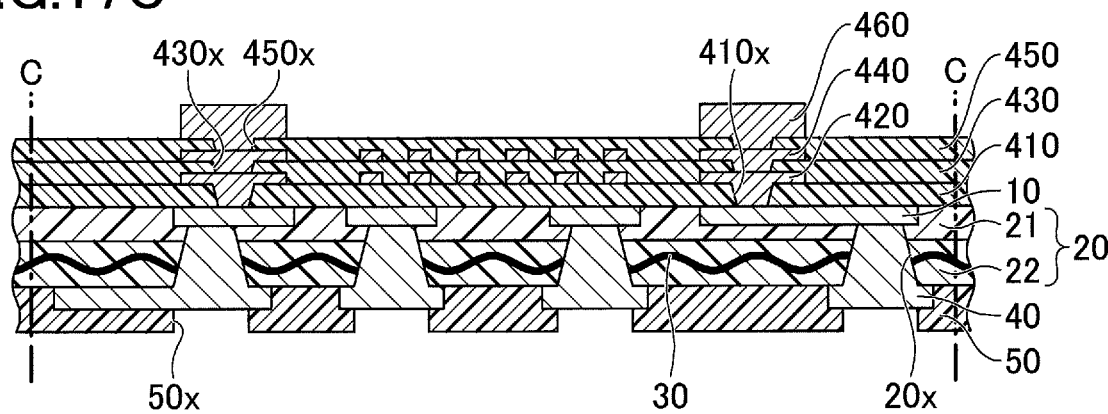

After the step of FIG. 17C, by cutting the structure body illustrated in FIG. 17C at cut positions C by a slicer or the like to be individualized, a plurality of the wiring boards 1F illustrated in FIG. 15 are completed. As necessary, the above described metal layer may be formed or the antioxidation process may be performed on the surface (only the upper surface, or the upper surface and the side surface) of each of the pads of the wiring layer 460. Further, a solder resist layer that exposes the pads of the wiring layer 460 may be formed on the other surface of the insulating layer 450.

As such, according to the wiring board 1F of the third embodiment, the other surface of the wiring layer 10 and the other surface of the insulating layer 20 (the other surface first insulating film 21) are polished to be a flat surface. Thus, the other surface of each of the insulating layers 410, 430 and 450 becomes a flat surface. As a result, the fine wiring layers 420, 440 and 460 can be easily formed on the flat surfaces of the insulating layers 410, 430 and 450, respectively.

Applied Example 3 of Wiring Board

In an applied example 3 of the wiring board, an example of a semiconductor package in which a semiconductor chip is mounted (flip-chip mounted) on the wiring board of the third embodiment is described. In the applied example 3 of the wiring board, components same as those already described in the above embodiments may not be repeated.

Figure 18:
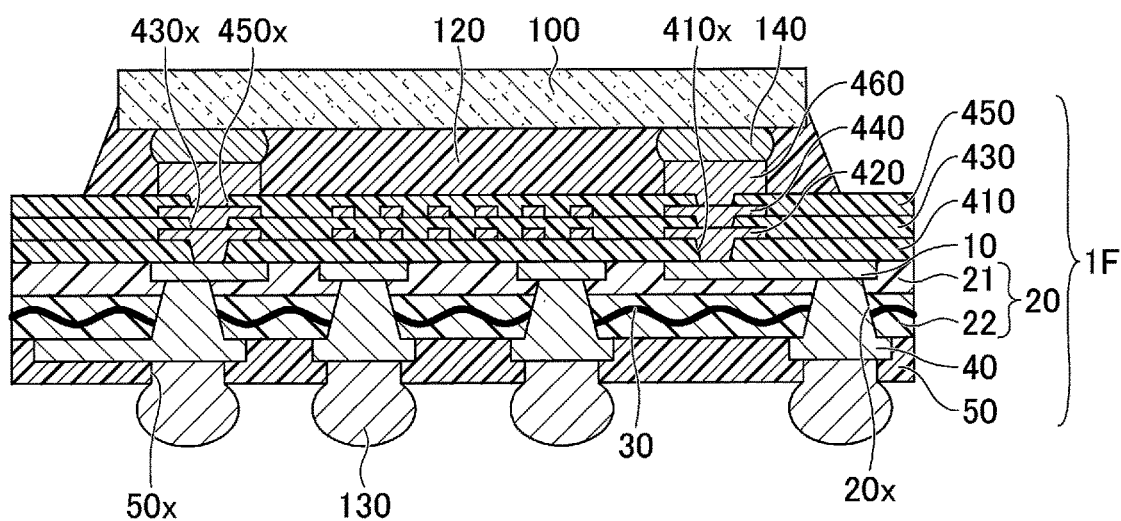
FIG. 18 is a cross-sectional view illustrating an example of a semiconductor package of an applied example 3.

FIG. 18 is a cross-sectional view illustrating an example of a semiconductor package 5C of the applied example 3. With reference to FIG. 18, the semiconductor package 5C includes the wiring board 1F illustrated in FIG. 15, the semiconductor chip 100, the solder bumps 140, the underfill resin 120 and the bumps 130. In the semiconductor package 5C, an insulating layer 450 side of the wiring board 1F is a chip mounting surface on which the semiconductor chip 100 is mounted, and a solder resist layer 50 side of the wiring board 1F is an external connection terminal surface on which the terminals for external connection are formed.

Each of the solder bumps 140 electrically connects the respective electrode pad (not illustrated in the drawings) of the semiconductor chip 100 and a respective pad composing the wiring layer 460 of the wiring board 1F. The semiconductor chip 100 may include copper pillars. As the material of the solder bump 140, for example, an alloy containing Pb, an alloy of Sn and Cu, an alloy of Sn and Ag, an alloy of Sn, Ag and Cu or the like may be used.

The underfill resin 120 is filled between the semiconductor chip 100 and the wiring board 1F (the insulating layer 450). The bumps 130 are terminals for external connection that are formed at a surface of the wiring layer 40 exposed at the bottom portion of each of the open portions 50x of the solder resist layer 50.

As such, by mounting the semiconductor chip 100 on the wiring board 1F of the third embodiment, the semiconductor package 5C can be actualized.

Fourth Embodiment

In a fourth embodiment, an example of a wiring board including a single wiring layer and a single insulating layer is described. In the fourth embodiment, components same as those already described in the above embodiments may not be repeated.

Structure of Wiring Board of Fourth Embodiment

Figure 19A:
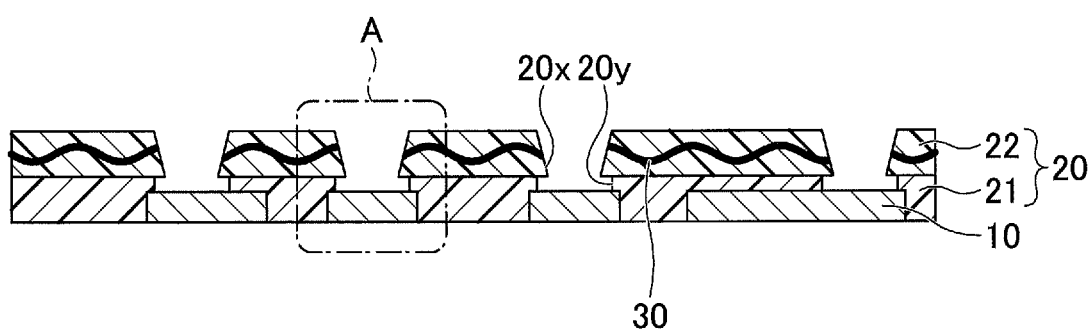
FIG. 19A and FIG. 19B are cross-sectional views illustrating an example of a wiring board of a fourth embodiment.
Figure 19B:
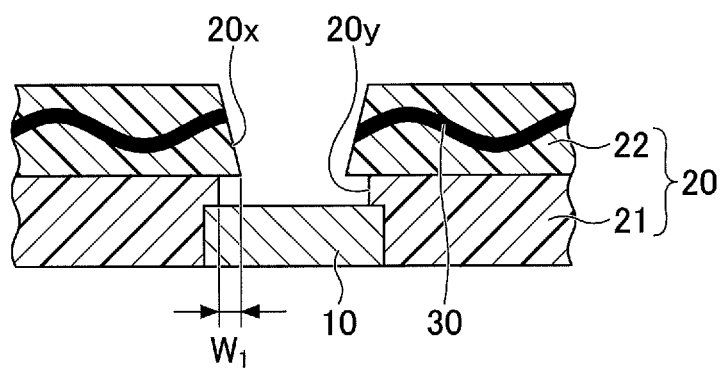

First, a structure of the wiring board of the fourth embodiment is described. FIG. 19A and FIG. 19B are cross-sectional views illustrating an example of a wiring board 1G of the fourth embodiment. FIG. 19A is a general view, and FIG. 19B is an enlarged view of a portion "A" of FIG. 19A. With reference to FIG. 19A and FIG. 19B, the wiring board 1G of the fourth embodiment is different from the wiring board 1 (see FIG. 1A and FIG. 1B) in that the wiring board 1G does not include the wiring layer 40, and the solder resist layers 50 and 60.

The wiring board 1G is composed of a single layer of the wiring layer 10 and a single layer of the insulating layer 20. Similar to the wiring board 1, the wiring layer 10 includes a plurality of the pads 10a that are connection terminals with a semiconductor chip, and the wiring patterns 10b connected to the pads 10a, respectively (see FIG. 1B).

Similar to the wiring board 1, the open portions 20x that expose the upper surface of the wiring layer 10 are formed in the insulating layer 20. Each of the open portions 20x is formed to have, for example, an inverse cone trapezoid shape where the diameter of an open portion at the one surface of the second insulating film 22 is larger than the diameter of a portion at the wiring layer 10 side. However, different from the wiring board 1, a circular concave portion 20y is formed at a portion of each of the open portions 20x formed in the first insulating film 21. The circular concave portion 20y is formed to expand an inner wall of each of the open portions 20x in the first insulating film 21. The width $W_1$ of the concave portion 20y may be, for example, about 1 to 5 μm.

The wiring layer 10 exposed in each of the open portions 20x functions as a pad for external connection. The pads for external connections are electrically connected to, for example, another wiring board, a semiconductor package, a semiconductor chip or the like. As necessary, terminals for external connection such as solder bumps may be provided at the upper surface of the wiring layer 10 exposed in each of the open portions 20x.

When the solder bumps are provided at the upper surface of the wiring layer 10 exposed in each of the open portions 20x, as the solder bumps are also provided in the concave portions 20y, respectively, the solder bumps are prevented from being removed (see FIG. 28B, which will be described later). Further, by forming the concave portions 20y, area of the upper surface of the wiring layer 10 exposed in each of the open portions 20x is increased and contact area between the upper surface of the wiring layer 10 and the respective solder bump is also increased. Thus, connection reliability between the wiring layer 10 and the solder bump can be improved.

Here, similar to the wiring board 1, in accordance with necessity, a metal layer may be formed or an OSP process may be performed on the upper surface of the wiring layer 10 exposed in each of the open portions 20x, or on the lower surface of the pads 10a of the wiring layer 10.

Method of Manufacturing Wiring Board of Fourth Embodiment

Next, a method of manufacturing the wiring board 1G of the fourth embodiment is described. FIG. 20A to FIG. 22C are views illustrating an example of manufacturing steps of the wiring board 1G of the fourth embodiment. In this embodiment, an example of manufacturing steps is described in which parts corresponding to the plurality of the wiring boards are manufactured on a support body, and after removing the support body, the plurality of wiring boards are manufactured by individualizing the parts. Alternatively, as another example of manufacturing steps, a single wiring board may be manufactured on a support body and the support body may be removed to obtain the wiring board.

Figure 20A:
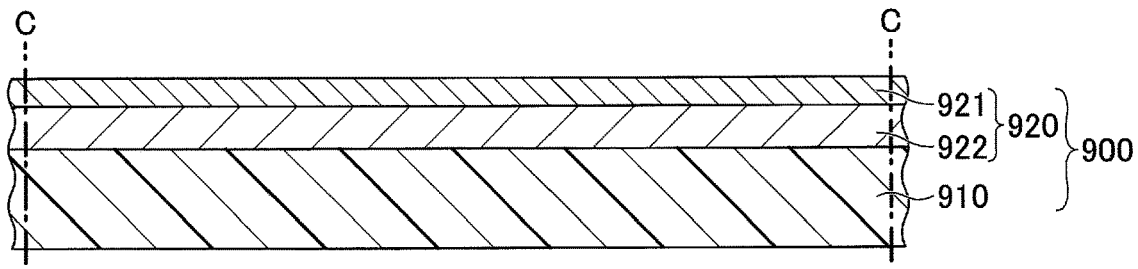
FIG. 20A to FIG. 20D are views illustrating an example of manufacturing steps of the wiring board of the fourth embodiment.

First, in a step illustrated in FIG. 20A, a support body 900 whose upper surface is a flat surface is prepared. As the support body 900, for example, a support body in which a metal foil 920 with a carrier is stacked on a prepreg 910 may be used. The thickness of the support body 900 may be, for example, about 18 to 100 μm.

The prepreg 910 may be, for example, obtained by impregnating woven cloth or nonwoven cloth (not illustrated in the drawings) such as a glass fiber or an aramid fiber with insulating resin such as epoxy-based resin or imide-based resin. The metal foil 920 with the carrier has a structure in which a thin foil 921 made of copper with a thickness of about 1.5 to 5 µm is detachably stuck on a thick foil (carrier foil) 922 made of copper with a thickness of about 10 to 50 µm through a peeling layer (not illustrated in the drawings). The thick foil 922 is provided as a support material for facilitating handling of the thin foil 921. A lower surface of the thick foil 922 is adhered at an upper surface of the prepreg 910.

Figure 20B:
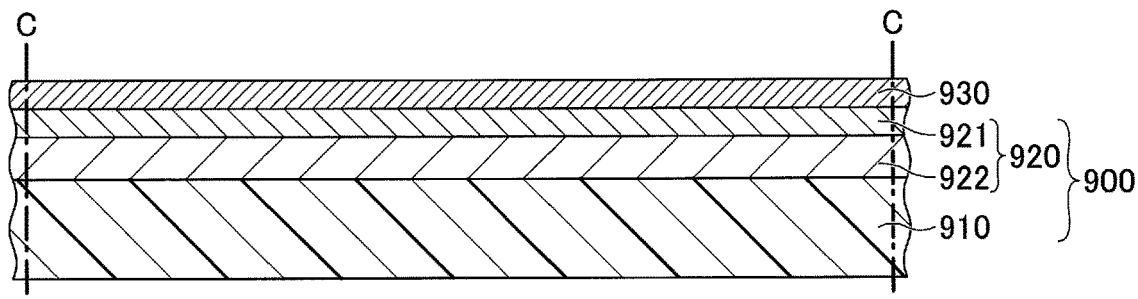

Next, in a step illustrated in FIG. 20B, a barrier layer 930 is formed on an upper surface of the thin foil 921 of the support body 900 by electrolytic plating or the like using the metal foil 920 with the carrier as a power supply layer, for example. The barrier layer 930 functions as an etching stop layer when removing the thin foil 921 by etching in the following step. As the material of the barrier layer 930, a metal that is not removed by etching solution for the thin foil 921 made of copper, for example, nickel (Ni) or the like may be used. The thickness of the barrier layer 930 may be, for example, about a few µm.

Figure 20C:
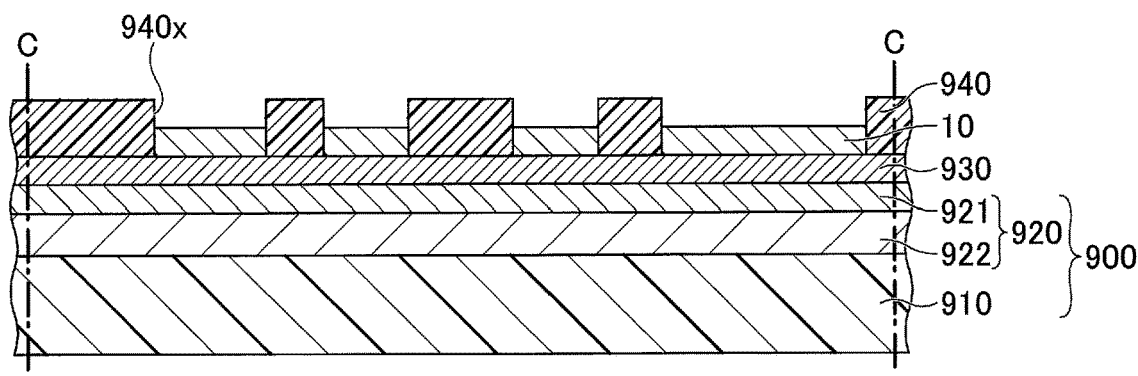
Figure 20D:
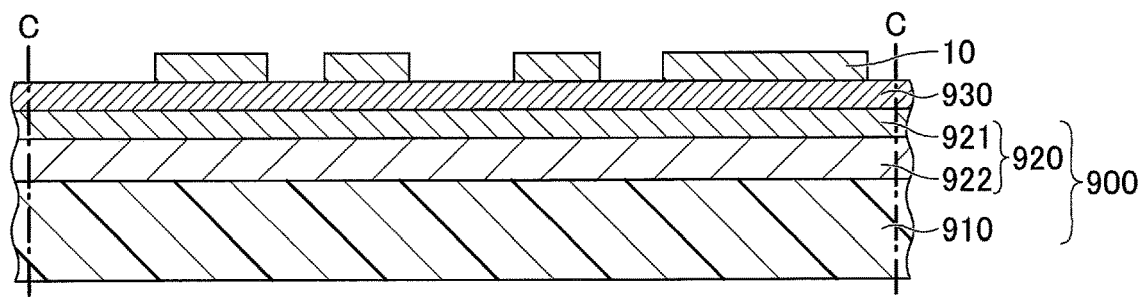

Next, in steps illustrated in FIG. 20C and FIG. 20D, the wiring layer 10 is selectively formed on an upper surface of the barrier layer 930. First, in the step illustrated in FIG. 20C, a resist layer 940 provided with open portions 940x at portions where the wiring layer 10 is to be formed is formed on the upper surface of the barrier layer 930. Specifically, for example, a dry film resist composed of photosensitive resin is laminated on the upper surface of the barrier layer 930 as the resist layer 940. Then, the dry film resist is patterned by exposing and developing to form the open portions 940x that expose the upper surface of the barrier layer 930 at the portions where the wiring layer 10 is to be formed.

Next, the wiring layer 10 is formed on the upper surface of the barrier layer 930 exposed in each of the open portions 940x of the resist layer 940 by electrolytic plating using the metal foil 920 with the carrier and the barrier layer 930 as power supply layers. One surface of the wiring layer 10 contacts the upper surface of the barrier layer 930 and the other surface of the wiring layer 10 is exposed in each of the open portions 940x. The material and the thickness of the wiring layer 10 are as described above.

Next, in a step illustrated in FIG. 20D, the resist layer 940 illustrated in FIG. 20C is removed. The resist layer 940 may be removed by, for example, peeling solution containing sodium hydrate or the like. With this, the wiring layer 10 is selectively formed on the upper surface of the barrier layer 930.

Figure 21A:
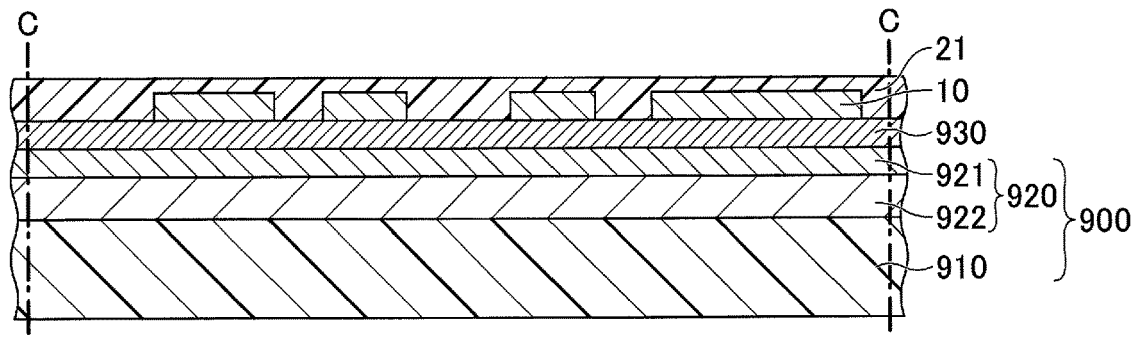
FIG. 21A to FIG. 21D are views illustrating an example of the manufacturing steps of the wiring board of the fourth embodiment.

Next, in a step illustrated in FIG. 21A, similar to the step illustrated in FIG. 2B, the first insulating film 21 at a B-stage state (semi-cured state) is formed on the upper surface of the barrier layer 930 so as to cover the wiring layer 10. The first insulating film 21 is composed of only insulating resin. In this step, the first insulating film 21 is not cured.

Figure 21B:
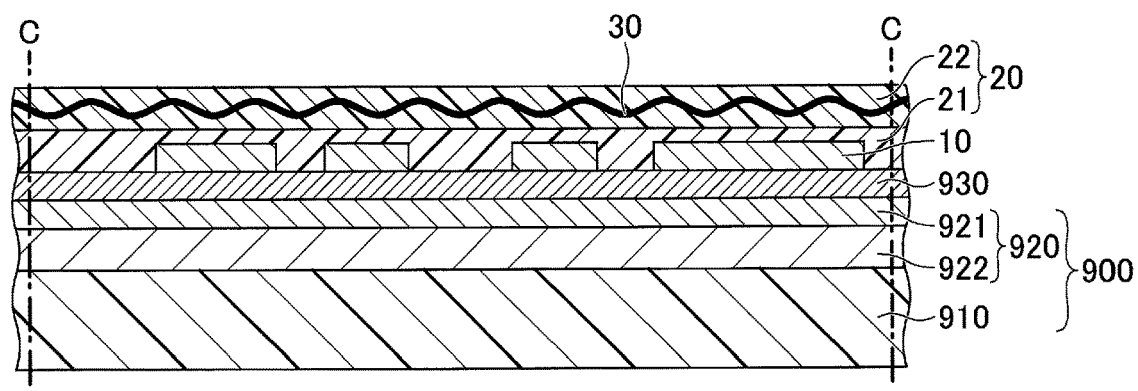

Next, in a step illustrated in FIG. 21B, similar to the step illustrated in FIG. 2C, the second insulating film 22 at a B-stage state (semi-cured state) is stacked on the upper surface of the first insulating film 21. The second insulating film 22 is a so-called prepreg obtained by impregnating the reinforcing member 30 with the insulating resin. The material of the reinforcing member 30 is as described above. After stacking the second insulating film 22 on the upper surface of the first insulating film 21, the first insulating film 21 and the second insulating film 22 are heated at predetermined temperature to be cured to manufacture the insulating layer 20. As necessary, the first insulating film 21 and the second insulating film 22 may be heated while being pressurized.

Figure 21C:
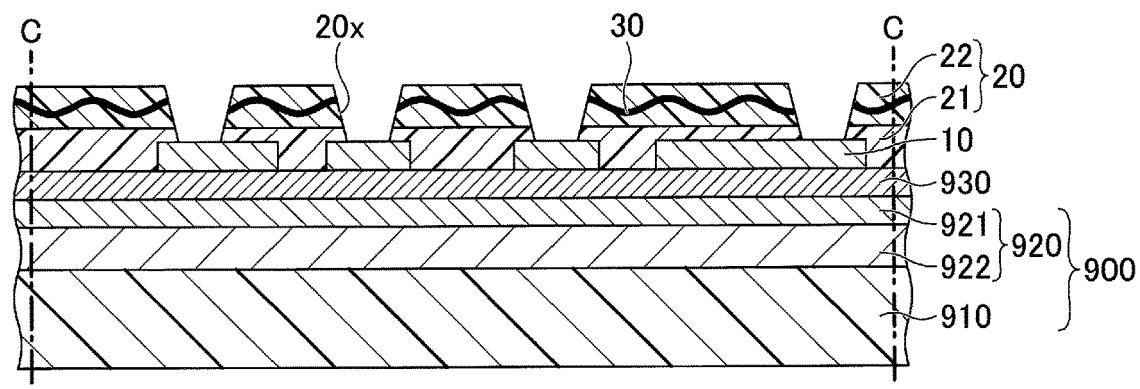

Next, in a step illustrated in FIG. 21C, similar to the step illustrated in FIG. 2D, the open portions 20x that penetrate the insulating layer 20 (the second insulating film 22 and the first insulating film 21) to expose the upper surface of the wiring layer 10 are formed in the insulating layer 20 by laser processing. Each of the open portions 20x is formed to have an inverse cone trapezoid shape where the diameter of an open portion is larger than the diameter at the wiring layer 10, for example.

Figure 21D:
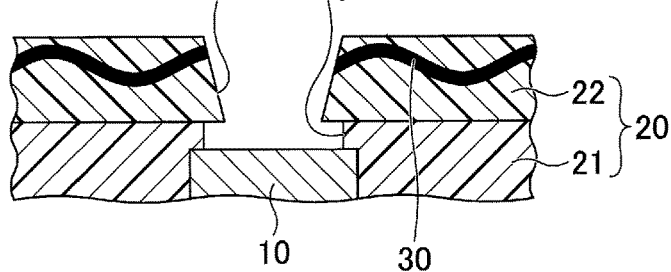

Next, in a step illustrated in FIG. 21D, a desmear process is performed to remove resin residue of the insulating layer 20 that is adhered on the upper surface of the wiring layer 10 exposed at the bottom portion of each of the open portions 20x. The first insulating film 21 that does not include a reinforcing member is easily etched compared with the second insulating film 22 including the reinforcing member 30. Thus, by adjusting a condition of the desmear process, the circular concave portion 20y that expands an inner wall of each of the open portions 20x in the first insulating film 21 can be formed at a portion of the respective open portion 20x formed in the first insulating film 21. This means that it is possible to form a step at the inner wall surface of each of the open portions 20x. FIG. 21D is an enlarged cross-sectional view illustrating one of the open portions 20x.

The desmear process may be performed in accordance with necessity. For forming the concave portions 20y without performing the desmear process, the concave portions 20y can be formed only by laser processing by adjusting the irradiating condition of laser in the step illustrated in FIG. 21C. Further, it is possible to form a part of the concave portions 20y by laser processing, and thereafter the concave portions 20y may be expanded by performing the desmear process. Further, by selecting resin that can be easily etched compared with resin of the second insulating film 22 for the first insulating film 21, the concave portions 20y can be easily formed.

It is of course possible not to form the concave portion 20y at the inner wall of each of the open portions 20x, as described above in the first to third embodiments, by adjusting the irradiating condition of laser and the condition of the desmear process.

Figure 22A:
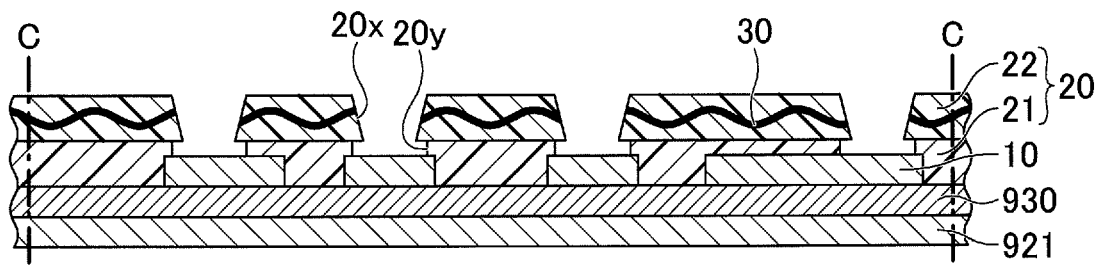
FIG. 22A to FIG. 22C are views illustrating an example of the manufacturing steps of the wiring board of the fourth embodiment.

Next, in a step illustrated in FIG. 22A, a part of the support body 900 is removed from the structure body illustrated in FIG. 21D. Specifically, an interface between the thin foil 921 and the thick foil 922 of the metal foil 920 with the carrier is peeled by applying mechanical force to the support body 900. As described above, the metal foil 920 with the carrier has the structure in which the thick foil 922 is stuck on the thin foil 921 through the peeling layer (not illustrated in the drawings). Thus, the thick foil 922 is easily peeled from the thin foil 921 with the peeling layer (not illustrated in the drawings).

With this, only the thin foil 921 remains at the barrier layer 930, and other members (the prepreg 910 and the thick foil 922) composing the support body 900 are removed. Here, in addition to a case that the thick foil 922 is removed from the thin foil 921 with the peeling layer, the thick foil 922 may be removed from the thin foil 921 by cohesion failure occurred in the peeling layer. Further, the thick foil 922 may be removed from the thin foil 921 because the thick foil 922 is peeled from the peeling layer.

Figure 22B:
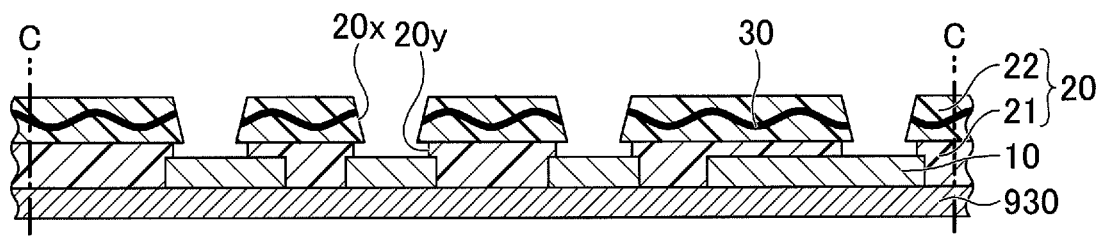

Next, in a step illustrated in FIG. 22B, the thin foil 921 (see FIG. 22A) made of copper is removed by etching. The thin foil 921 made of copper may be, for example, removed by wet etching using hydrogen peroxide/sulfuric acid-based aqueous solution, sodium persulfate aqueous solution, ammonium persulfate aqueous solution or the like. When the barrier layer 930 is made of nickel (Ni), the barrier layer 930 is not removed by the etching solution for copper and functions as the etching stop layer. Thus, the wiring layer 10 is not etched.

Figure 22C:
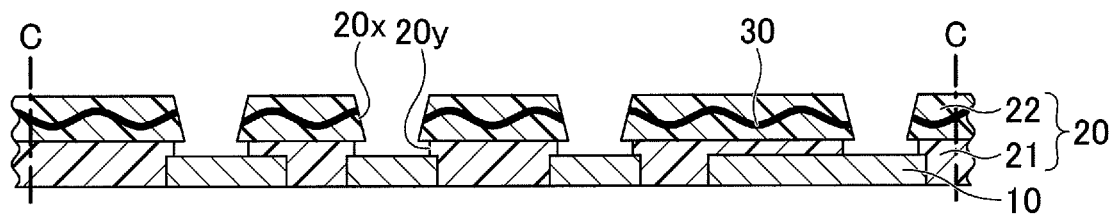

Next, in a step illustrated in FIG. 22C, the barrier layer 930 (see FIG. 22B) is removed. When the barrier layer 930 is made of nickel (Ni), by selecting etching solution that removes nickel (Ni) without removing copper, only the barrier layer 930 may be etched without etching the wiring layer 10. With this, the one surface of the wiring layer 10 is exposed at the one surface of the insulating layer 20. The one surface of the wiring layer 10 may be, for example, flush with the one surface of the insulating layer 20.

As necessary, a metal layer may be formed on the upper surface of the wiring layer 10 exposed in each of the open portions 20x, and the lower surface of each of the pads 10a of the wiring layer 10 by electroless plating or the like, for example. The example of the metal layer is as described above. Further, instead of forming the metal layer, the antioxidation process such as the OSP process may be performed.

After the step illustrated in FIG. 22C, by cutting the structure body illustrated in FIG. 22C at cut positions C by a slicer or the like to be individualized, a plurality of the wiring boards 1G (see FIG. 19A) are completed. As necessary, terminals for external connection such as solder bumps may be provided on the lower surface of the wiring layer 10 or the upper surface of the wiring layer 10 exposed in each of the open portions 20x.

Further, in accordance with necessity, similar to the wiring board 1 illustrated in FIG. 1A and FIG. 1B, the solder resist layer 60 provided with the open portion 60x may be formed on a chip mounting surface of the wiring board 1G. The solder resist layer 60 may be formed before cutting the structure body illustrated in FIG. 22C at cut positions C by a slicer or the like, or after cutting the structure body.

As such, as the wiring board 1G is configured by a single layer of the wiring layer and a single layer of the insulating layer, the wiring board 1G can be made thin. If the wiring board is made thin, warping may be generated in the wiring board. However, according to the wiring board 1G, the insulating layer 20 is configured to have a structure in which the second insulating film 22 including the reinforcing member 30 is stacked on the first insulating film 21. Thus, generation of warping can be suppressed. Specifically, as described above, for each of the first insulating film 21 and the second insulating film 22, by setting CTE (coefficient of thermal expansion) to be lower than or equal to 15 ppm/° C. by adjusting the type or the thickness of the insulating resin, or the type, the content or the like of the filler, warping of the wiring board 1G can be suppressed.

Further, in the wiring board 1G, when solder bumps are formed on the upper surface of the wiring layer 10 exposed in each of the open portions 20x, the solder bumps are also provided in the concave portions 20y, respectively, and the solder bumps are prevented from being removed. Further, by forming the concave portions 20y, area of the upper surface of the wiring layer 10 exposed in each of the open portions 20x is increased and contact area between the upper surface of the wiring layer 10 and the respective solder bump is also increased. Thus, connection reliability between the wiring layer 10 and the solder bump can be improved.

Alternative Example 1 of Fourth Embodiment

In an alternative example 1 of the fourth embodiment, another example of a method of manufacturing the wiring board 1G is described. In the alternative example 1 of the fourth embodiment, components same as those already described in the above embodiments may not be repeated.

Figure 23A:
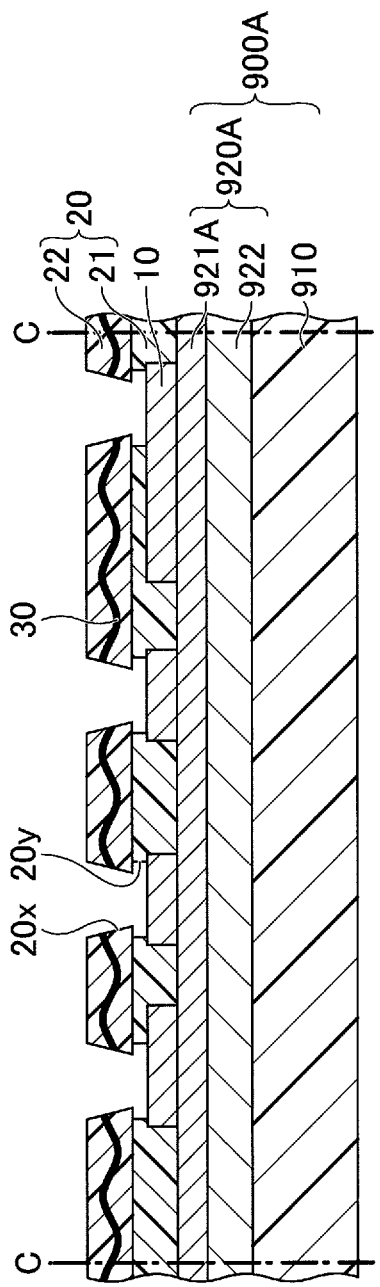
FIG. 23A to FIG. 23C are views illustrating an example of the manufacturing steps of the wiring board of the fourth embodiment.
Figure 23B:
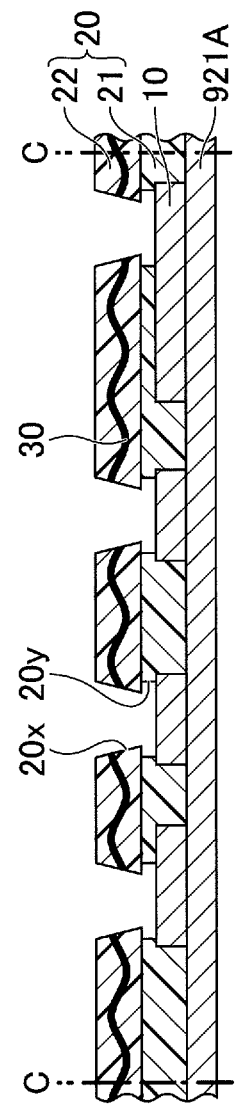
Figure 23C:
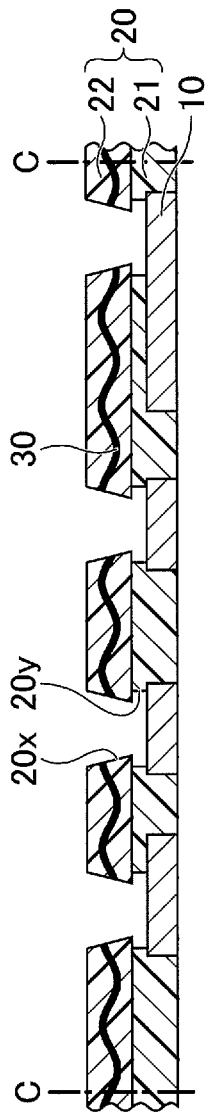

FIG. 23A to FIG. 23C are views illustrating an example of manufacturing steps of the wiring board 1G of the alternative example 1 of the fourth embodiment. In the alternative example 1 of the fourth embodiment, a support body 900A in which a metal foil 920A with a carrier is stacked on the prepreg 910 is used. The metal foil 920A with the carrier has a structure in which a thin foil 921A made of nickel with a thickness of about 1.5 to 5 µm is detachably stuck on a thick foil (carrier foil) 922 made of copper with a thickness of about 10 to 50 µm through a peeling layer (not illustrated in the drawings). As the thin foil 921A functions as an etching stop layer, the barrier layer 930 is not formed on the support body 900A.

First, in a step illustrated in FIG. 23A, similar to the step illustrated in FIG. 20A, the support body 900A is manufactured. Then, steps similar to the steps of FIG. 20C to FIG. 21D are performed, and the wiring layer 10 and the insulating layer 20 are directly stacked on the support body 900A. Then, the open portions 20x and the concave portions 20y are formed in the insulating layer 20.

Next, in a step illustrated in FIG. 23B, similar to the step illustrated in FIG. 22A, the prepreg 910 and the thick foil 922 of the support body 900A are removed from the structure body illustrated in FIG. 23A. With this, only the thin foil 921A remains at the insulating layer 20, and other members (the prepreg 910 and the thick foil 922) composing the support body 900A are removed.

Next, in a step illustrated in FIG. 23C, the thin foil 921A (see FIG. 23B) made of nickel is removed by etching. By selecting etching solution that removes nickel (Ni) without removing copper, only the thin foil 921A may be etched without etching the wiring layer 10. With this, the one surface of the wiring layer 10 is exposed at the one surface of the insulating layer 20. The one surface of the wiring layer 10 may be, for example, flush with the one surface of the insulating layer 20.

After the step illustrated in FIG. 23C, by cutting the structure body illustrated in FIG. 23C at cut positions C by a slicer or the like to be individualized, a plurality of the wiring boards 1G (see FIG. 19A) are completed.

As necessary, a metal layer may be formed on the upper surface of the wiring layer 10 exposed in each of the open portions 20x and the lower surface of the pads 10a of the wiring layer 10 by electroless plating or the like, for example. An example of the metal layer is as described above. Further, instead of forming the metal layer, an antioxidation process such as an OSP process may be performed. Further, in accordance with necessity, terminals for external connection such as solder bumps may be provided on the upper surface of the wiring layer 10 exposed in each of the open portions 20x or the lower surface of the pads 10a of the wiring layer 10. Further, in accordance with necessity, similar to the wiring board 1 illustrated in FIG. 1A and FIG. 1B, the solder resist layer 60 provided with the open portion 60x may be formed on a chip mounting surface (the lower surface of the pads 10a of the wiring layer 10) of the wiring board 1G.

Alternative Example 2 of Fourth Embodiment

In an alternative example 2 of the fourth embodiment, an example is described in which a positional relationship between the one surface of the wiring layer 10 and the one surface of the insulating layer 20 are different from that in the fourth embodiment. In the alternative example 2 of the fourth embodiment, components same as those already described in the above embodiments may not be repeated.

Figure 24A:
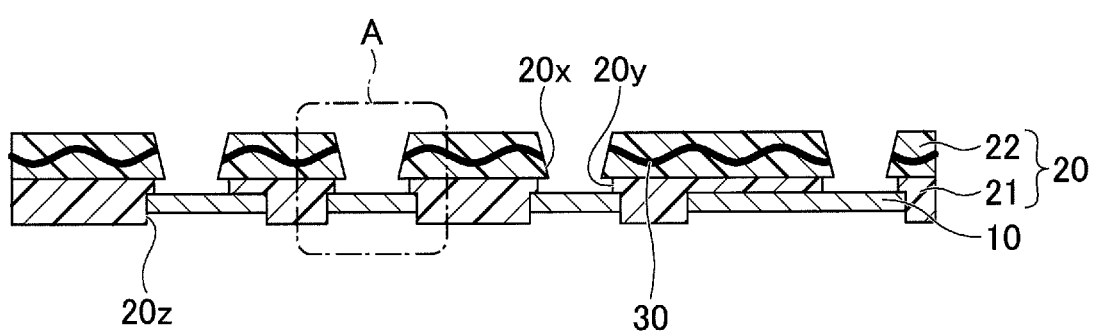
FIG. 24A and FIG. 24B are cross-sectional views illustrating an example of a wiring board of an alternative example 2 of the fourth embodiment.
Figure 24B:
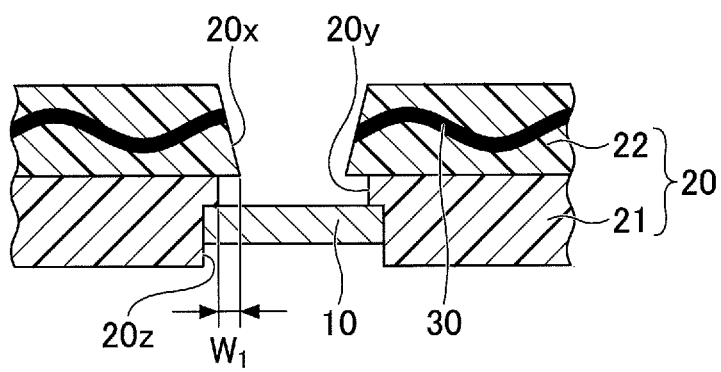

FIG. 24A and FIG. 24B are cross-sectional views illustrating an example of a wiring board 1H of the alternative example 2 of the fourth embodiment, corresponding to FIG. 19A and FIG. 19B, respectively.

With reference to FIG. 24A and FIG. 24B, the wiring board 1H is different from the wiring board 1G (see FIG. 19A) in that concave portions 20z that are concaved in a thickness direction are formed at the one surface of the insulating layer 20, and the one surface of the wiring layer 10 is exposed at a position that is concaved with respect to the one surface of the insulating layer 20 in each of the concave portions 20z. The wiring board 1H may be, for example, manufactured by the following steps.

Figure 25A:
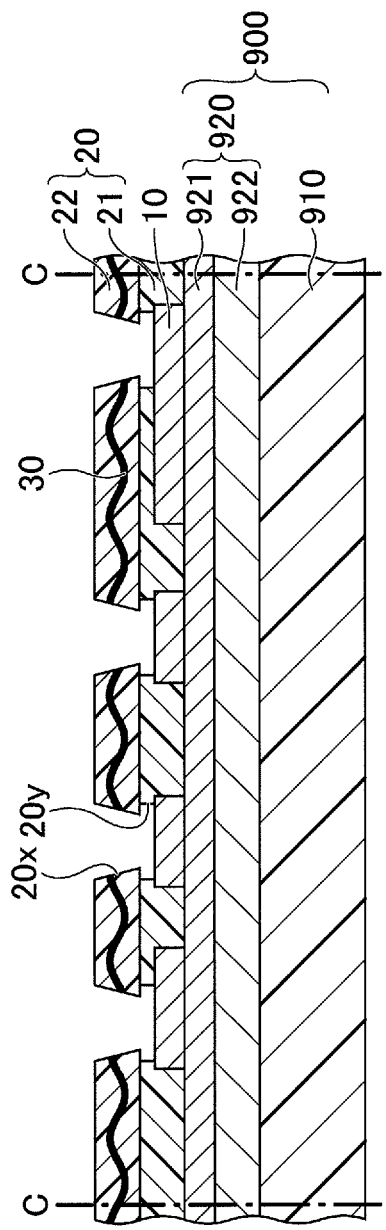
FIG. 25A to FIG. 25C are views illustrating an example of manufacturing steps of the wiring board of the alternative example 2 of the fourth embodiment.
Figure 25B:
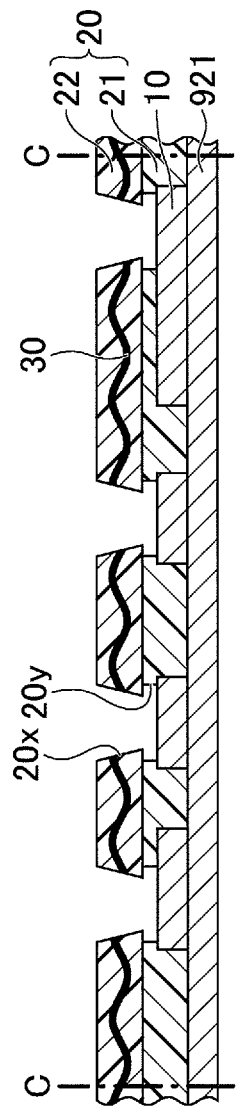
Figure 25C:
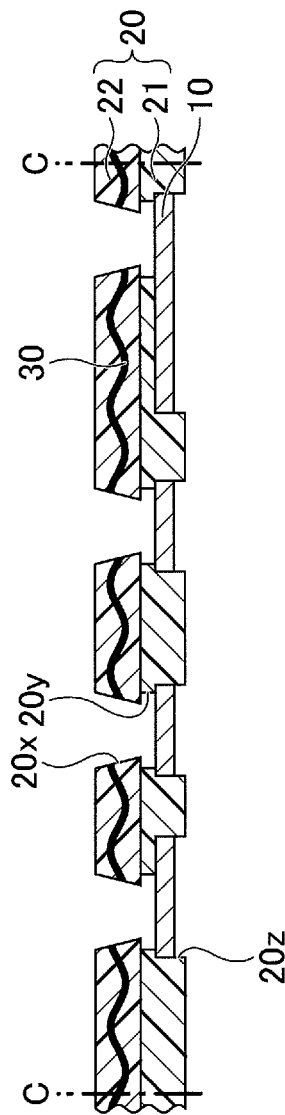

FIG. 25A to FIG. 25C are views illustrating an example of manufacturing steps of the wiring board 1H of the alternative example 2 of the fourth embodiment. In the alternative example 2 of the fourth embodiment, the barrier layer 930 is not formed on the support body 900.

First, in a step illustrated in FIG. 25A, after the step illustrated in FIG. 20A, by performing steps similar to those of FIG. 20C to FIG. 21D, the wiring layer 10 and the insulating layer 20 are directly stacked on the support body 900. Then, the open portions 20x and the concave portions 20y are formed in the insulating layer 20. Here, the step illustrated in FIG. 20B is not performed (the barrier layer 930 is not formed).

Next, in a step illustrated in FIG. 25B, similar to the step illustrated in FIG. 22A, the prepreg 910 and the thick foil 922 of the support body 900 are removed from the structure body illustrated in FIG. 25A. With this, only the thin foil 921 remains at the insulating layer 20, and other members (the prepreg 910 and the thick foil 922) composing the support body 900 are removed.

Next, in a step illustrated in FIG. 25C, the thin foil 921 (see FIG. 25B) made of copper is removed by etching. In this embodiment, as the barrier layer 930 that functions as an etching stop layer does not exist, the one surface of the wiring layer 10 made of copper is also etched, and the concave portions 20z are formed at the one surface of the insulating layer 20. Then, the one surface of the wiring layer 10 is exposed at a position concaved from the one surface of the insulating layer 20 in each of the concave portions 20z.

After the step illustrated in FIG. 25C, by cutting the structure body illustrated in FIG. 25C at cut positions C by a slicer or the like to be individualized, a plurality of the wiring boards 1H (FIG. 24A) are completed.

As necessary, a metal layer may be formed on the upper surface of the wiring layer 10 exposed in each of the open portions 20x and the lower surface of the pad 10a of the wiring layer 10 exposed in each of the concave portions 20z by electroless plating or the like, for example. An example of the metal layer is as described above. Further, instead of forming the metal layer, an antioxidation process such as an OSP process may be performed. Further, in accordance with necessity, terminals for external connection such as solder bumps may be formed on the upper surface of the wiring layer 10 exposed in each of the open portions 20x or the lower surface of the pad 10a of the wiring layer 10 exposed in each of the concave portions 20z. Further, in accordance with necessity, similar to the wiring board 1 illustrated in FIG. 1A and FIG. 1B, the solder resist layer 60 provided with the open portion 60x may be formed on a chip mounting surface of the wiring board 1H (the lower surface of the pads 10a of the wiring layer 10).

Alternative Example 3 of Fourth Embodiment

In an alternative example 3 of the fourth embodiment, an example in which a support body (carrier) is provided at the other surface of the insulating layer is described. In the alternative example 3 of the fourth embodiment, components same as those already described in the above embodiments may not be repeated.

Figure 26A:
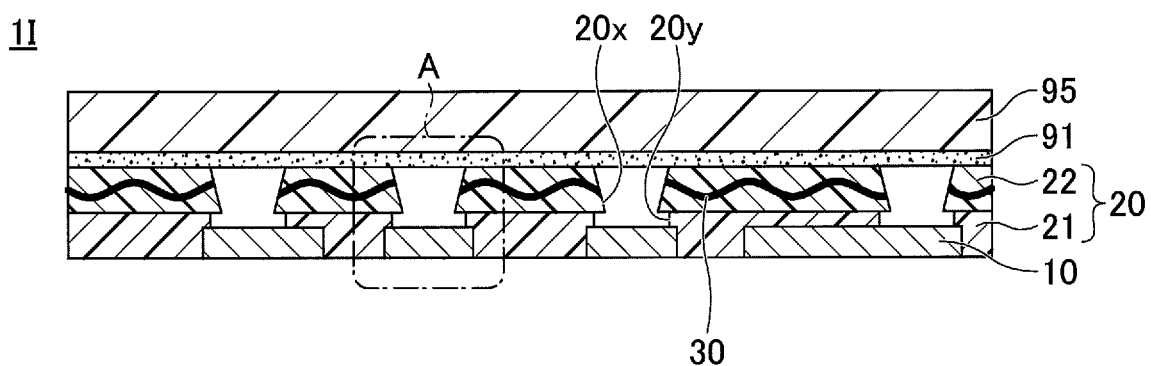
FIG. 26A and FIG. 26B are cross-sectional views illustrating an example of a wiring board of an alternative example 3 of the fourth embodiment.
Figure 26B:
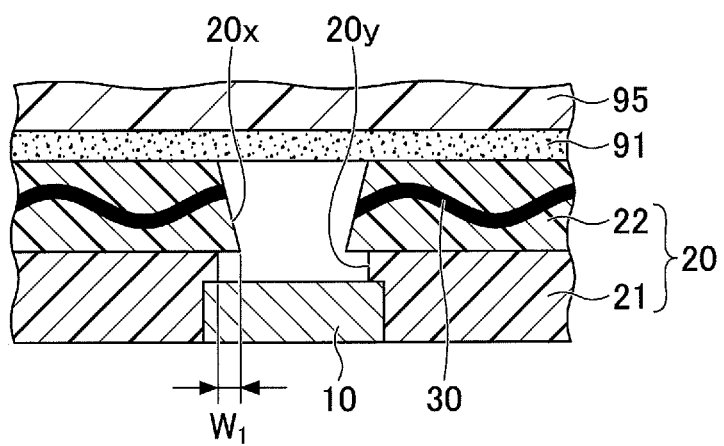

FIG. 26A and FIG. 26B are cross-sectional views illustrating an example of a wiring board 1I of the alternative example 3 of the fourth embodiment, corresponding to FIG. 19A and FIG. 19B, respectively.

With reference to FIG. 26A and FIG. 26B, the wiring board. 1I is different from the wiring board 1G (see FIG. 19A and FIG. 19B) in that a support body 95 is provided at the other surface of the insulating layer 20 through an adhesive layer 91. The wiring board 1I may be manufactured by, for example, the following steps.

FIG. 27A to FIG. 27D are views illustrating an example of manufacturing steps of the wiring board 1I of the alternative example 3 of the fourth embodiment.

Figure 27A:
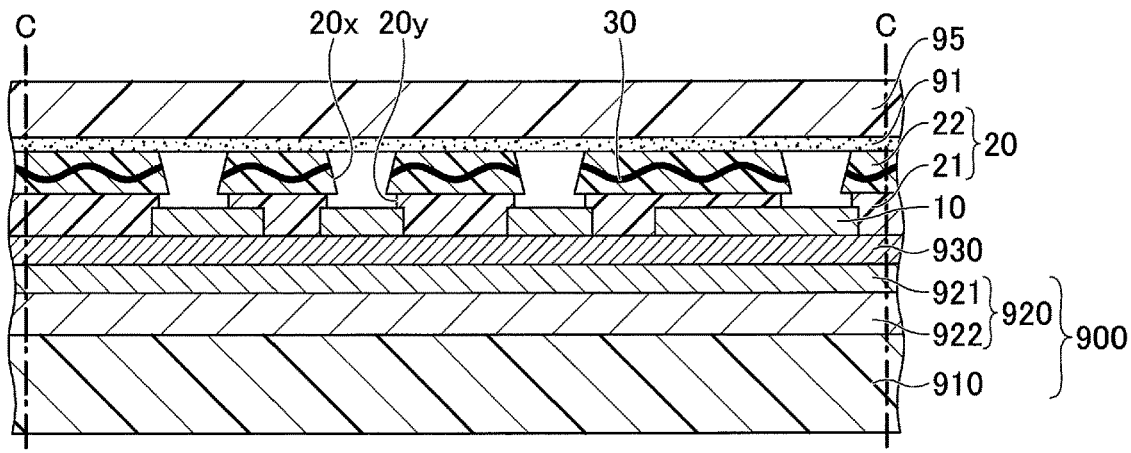
FIG. 27A to FIG. 27D are views illustrating an example of manufacturing steps of the wiring board of the alternative example 3 of the fourth embodiment.

First, in a step illustrated in FIG. 27A, by performing steps similar to those of FIG. 20A to FIG. 21D, the structure body of FIG. 21D is manufactured. Then, the support body 95 is provided on the other surface of the insulating layer 20 of the structure body of FIG. 21D through the adhesive layer 91. As the adhesive layer 91, for example, acryl-based resin, silicone-based resin, epoxy-based resin or the like may be used. As the support body 95, for example, a metal foil (a copper foil, for example), a resin film (a polyimide film, for example), a resin substrate (a glass epoxy substrate, for example) or the like may be used.

As will be described later, there is a case that a semiconductor chip is mounted on the wiring board 1I including the adhesive layer 91 and the support body 95. Thus, it is necessary for the adhesive layer 91 and the support body 95 to have heat resistance property capable of enduring heat that is applied in a mounting step such as reflowing.

Figure 27B:
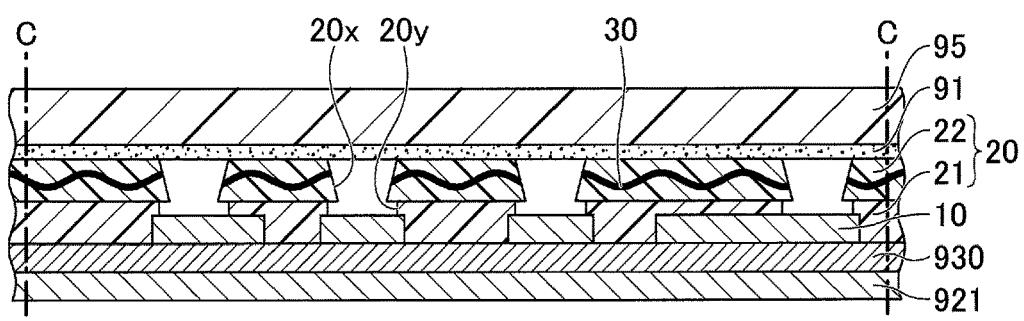

Next, in a step illustrated in FIG. 27B, similar to the step illustrated in FIG. 22A, the prepreg 910 and the thick foil 922 of the support body 900 are removed from the structure body illustrated in FIG. 27A. With this, only the thin foil 921 remains at the barrier layer 930, and other members (the prepreg 910 and the thick foil 922) composing the support body 900 are removed.

Figure 27C:
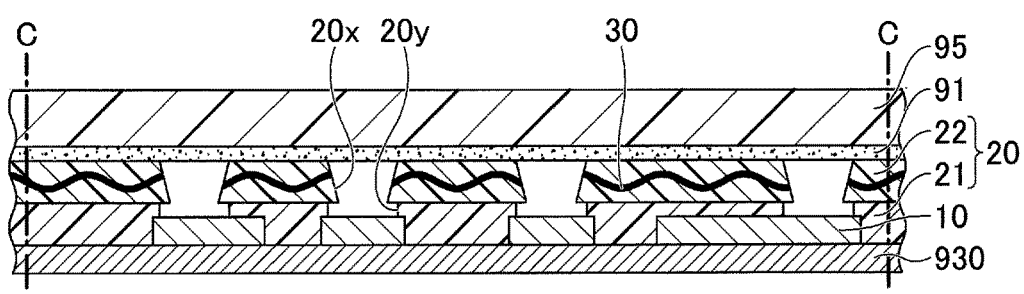

Next, in a step illustrated in FIG. 27C, similar to the step illustrated in FIG. 22B, the thin foil 921 (see FIG. 27B) made of copper is removed by etching. Next, in a step illustrated in FIG. 27D, similar to the step illustrated in FIG. 22C, the barrier layer 930 (see FIG. 27C) is removed. With this, the one surface of the wiring layer 10 is exposed at the one surface of the insulating layer 20. The one surface of the wiring layer 10 may be, for example, flush with the one surface of the insulating layer 20.

Figure 27D:
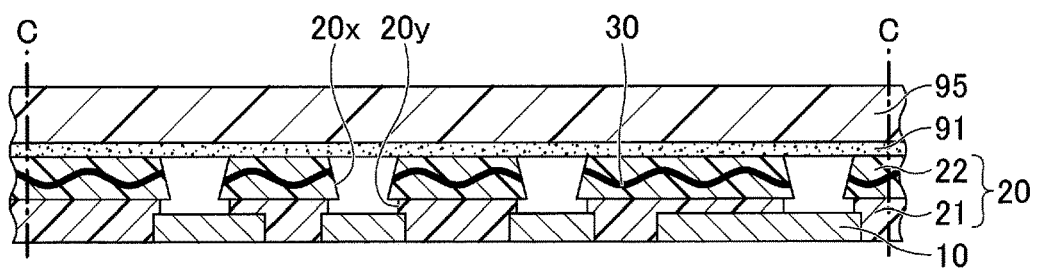

After the step illustrated in FIG. 27D, by cutting the structure body illustrated in FIG. 27D at cut positions C by a slicer or the like to be individualized, a plurality of the wiring boards 1I (see FIG. 26A) are completed.

As necessary, a metal layer may be formed on the upper surface of the wiring layer 10 exposed in each of the open portions 20x of the structure body of FIG. 21D by electroless plating or the like, for example, before providing the support body 95 in the structure body of FIG. 21D and forming the structure body of FIG. 27A. An example of the metal layer is as described above. Further, instead of forming the metal layer, an antioxidation process such as an OSP process may be performed.

Further, in accordance with necessity, after the step illustrated in FIG. 27D, a metal layer may be formed on the lower surface of the pads 10a of the wiring layer 10 by electroless plating or the like, for example. An example of the metal layer is as described above. Further, instead of forming the metal layer, an antioxidation process such as an OSP process may be performed.

Further, in accordance with necessity, after the step illustrated in FIG. 27D, similar to the wiring board 1 illustrated in FIG. 1A and FIG. 1B, the solder resist layer 60 provided with the open portion 60x may be formed on a chip mounting surface (the lower surface of the pads 10a of the wiring layer 10) of the wiring board 1I.

Further, the structure body illustrated in FIG. 27C, in other words, a wiring board including the barrier layer 930 and the support body 95 may be delivered as a product. Further, the structure body illustrated in FIG. 27C or the structure body illustrated in FIG. 27D may be delivered as a product before being individualized, or after being individualized.

Figure 29A:
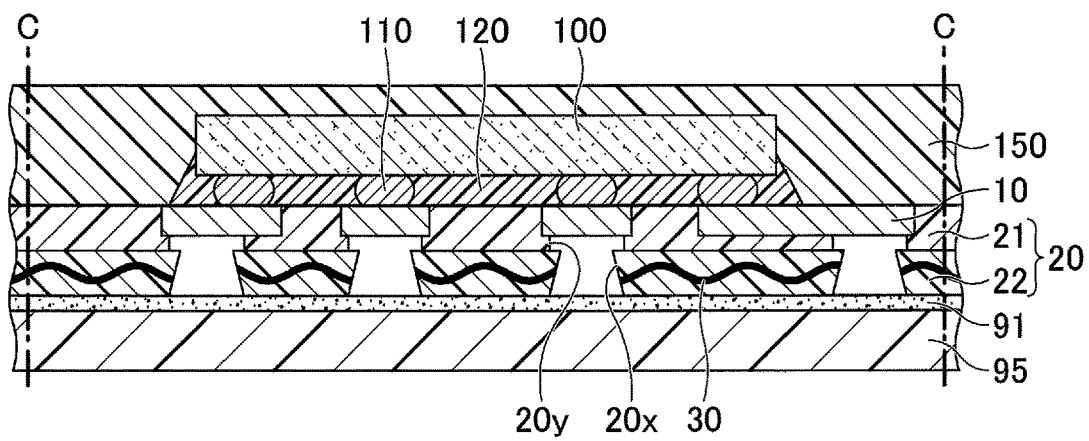
FIG. 29A to FIG. 29C are views illustrating an example of manufacturing steps of the semiconductor package of the applied example 4.

As the support body 95 is provided at the other surface of the insulating layer 20 in the wiring board 1I, rigidity of the entirety of the wiring board 1I can be increased. Thus, for example, as illustrated in FIG. 29A, which will be described later, it is easy to mount a semiconductor chip after the wiring board 1I is delivered.

Here, the support body 95 may be provided at the wiring board 1H illustrated in FIG. 24A. Further, steps similar to the steps of FIG. 27A to FIG. 27D may be performed on the structure body to manufacture the wiring board 1H.

Applied Example 4 of Wiring Board

In an applied example 4 of the wiring board, an example of a semiconductor package is described in which a semiconductor chip is mounted (flip-chip mounted) on the wiring board 1G of the fourth embodiment. In the applied example 4 of the wiring board, components same as those already described in the above embodiments may not be repeated.

Figure 28A:
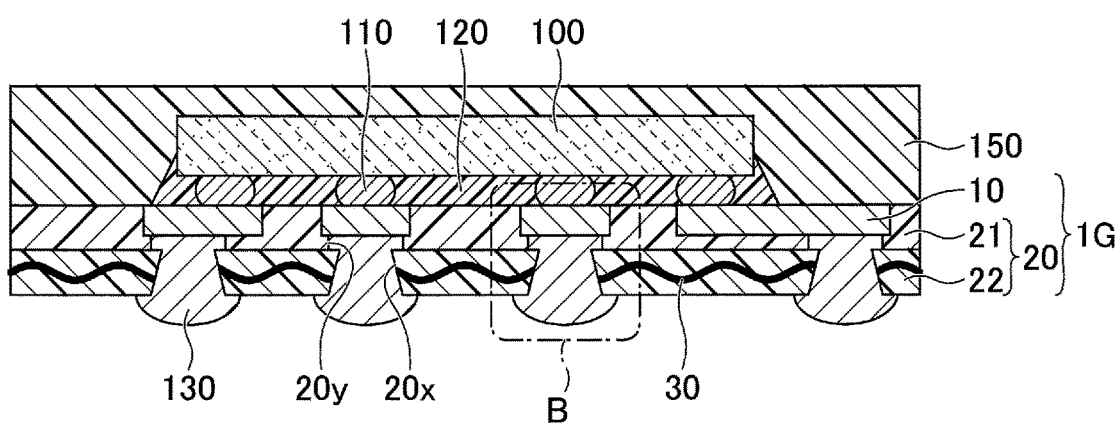
FIG. 28A and FIG. 28B are cross-sectional views illustrating an example of a semiconductor package of an applied example 4.
Figure 28B:
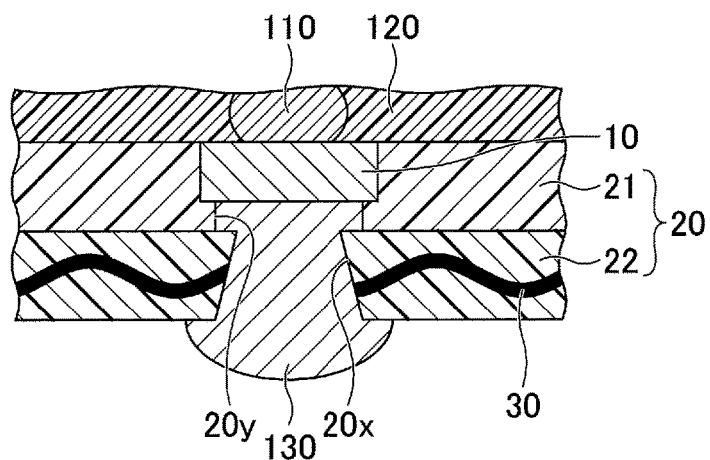

FIG. 28A and FIG. 28B are cross-sectional views illustrating an example of a semiconductor package 5D of the applied example 4. FIG. 28A is a general view, FIG. 28B is an enlarged view of a portion "B" of FIG. 28A. With reference to FIG. 28A, the semiconductor package 5D includes the wiring board 1G illustrated in FIG. 19A, the semiconductor chip 100, the bumps 110, the underfill resin 120, the bumps 130 and the sealing resin 150.

the sealing resin 150 is formed on the wiring board 1G so as to cover the semiconductor chip 100 and the underfill resin 120. However, the upper surface (back surface) of the semiconductor chip 100 may be exposed from the upper surface of the sealing resin 150. As the sealing resin 150, for example, insulating resin (so-called mold resin) such as thermosetting epoxy-based resin containing filler may be used.

The underfill resin 120 may be provided in accordance with necessity. Further, only the underfill resin 120 may be provided without providing the sealing resin 150.

The bumps 130 are terminals for external connection formed on the one surface of the wiring layer 10 exposed in each of the open portions 20x. As described above, the bumps 130 are, for example, solder bumps. In the wiring board 1G, the circular concave portion 20y is formed at a portion of each of the open portions 20x formed in the first insulating film 21 to expand an inner wall of each of the open portions 20x in the first insulating film 21. Thus, a part of the bump 130 is introduced in the concave portion 20y. Therefore, the solder bumps 130 are prevented from being removed. Further, by forming the concave portions 20y, area of the one surface of the wiring layer 10 exposed in each of the open portions 20x is increased and contact area between the one surface of the wiring layer 10 and the respective bump 130 is also increased. Thus, connection reliability between the wiring layer 10 and the bump 130 can be improved.

For manufacturing the semiconductor package 5D, for example, the semiconductor chip 100 is mounted on the chip mounting surface of the wiring board 1G in a face-down manner through the bumps 110 in a paste form. Then, the bumps 110 are melted and solidified by reflowing or the like to electrically connect the electrode pads (not illustrated in the drawings) of the semiconductor chip 100 and the pads 10a of the wiring board 1G.

Thereafter, after filling the underfill resin 120 between the semiconductor chip 100 and the wiring board 1G (insulating layer 20) in accordance with necessity, the sealing resin 150 is formed on the wiring board 1G so as to cover the semiconductor chip 100 and the underfill resin 120. The sealing resin 150 may be formed by, for example, transfer molding process or the like using a sealing die.

In the semiconductor package 5D, instead of using the wiring board 1G, the wiring board 1H or 1I may be used. For example, the wiring boards 1I after the step of FIG. 27D which are not individualized may be used. In this case, as illustrated in FIG. 29A, the semiconductor chip 100 is mounted on a chip mounting surface of each area corresponding to each of the wiring boards 1I in a face-down manner via the bumps 110 in a paste form.

Then, the bumps 110 are melted and solidified by reflowing or the like to electrically connect the electrode pads (not illustrated in the drawings) of the semiconductor chip 100 and the pads 10a at the respective area. Thereafter, in accordance with necessity, the underfill resin 120 is filled between the semiconductor chip 100 and the insulating layer 20. Further, the sealing resin 150 is formed on each of the areas corresponding to the respective wiring board 1I so as to cover the respective semiconductor chip 100 and the underfill resin 120 by a transfer molding process or the like. The wiring board 1I is illustrated in a reversed state in FIG. 29A to FIG. 29C compared with FIG. 27A to FIG. 27D.

Figure 29B:
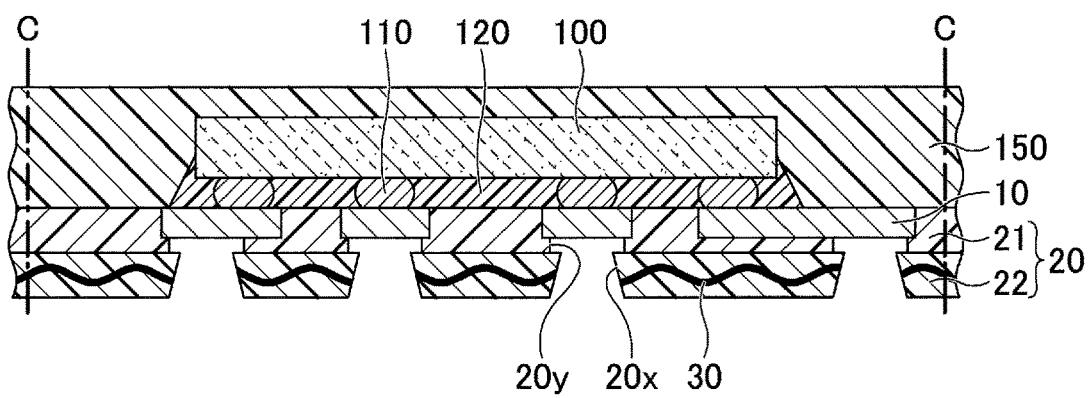

Next, as illustrated in FIG. 29B, the adhesive layer 91 and the support body 95 are removed from the insulating layer 20 by applying mechanical force to the support body 95 illustrated in FIG. 29A. Then, as illustrated in FIG. 29C, the bumps 130 such as the solder bumps are formed on the wiring layer 10 exposed in each of the open portions 20x.

Figure 29C:
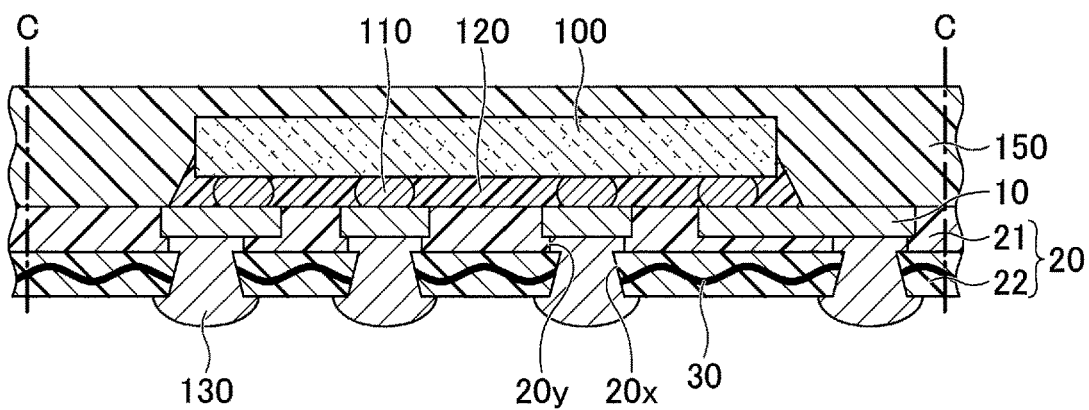

After the step illustrated in FIG. 29C, by cutting the structure body illustrated in FIG. 29C at cut positions C by a slicer or the like to be individualized, a plurality of the semiconductor packages 5D (see FIG. 28A) are completed.

As such, by mounting the semiconductor chip 100 on the wiring board 1G to 1I, the semiconductor package 5D can be actualized. According to the method of manufacturing as illustrated FIG. 29A, the support body 95 is removed after the sealing resin 150 is formed. Thus, even when the rigidity of the wiring board is low, deformation of the wiring board can be prevented.

According to the embodiment, a wiring board whose strength is retained and insulation reliability is improved is provided.

Although a preferred embodiment of the wiring board and the method of manufacturing the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, it is described in the above embodiments, a case in which the lower surface of the first insulating film 21 and the lower surface of the wiring layer 10 (exposed surface) are flush with each other, and a case in which the lower surface of the wiring layer 10 is concaved from the lower surface of the first insulating film 21. However, the lower surface of the wiring layer 10 may be positioned to protrude from the lower surface of the first insulating film 21.

Further, in the first to third embodiments, a metal foil or a metal plate made of nickel, chromium, iron or the like, other than copper, that can be removed by etching solution different from that for the wiring layer 10 made of copper may be used as the support body 300. In such a case, the lower surface of the wiring layer 10 becomes flush with the lower surface of the first insulating film 21.

Further, in the first to third embodiments, an etching barrier layer made of a metal different from that of the wiring layer 10 may be formed on the upper surface of the support body 300 made of a metal same as that of the wiring layer 10. For example, when both of the wiring layer 10 and the support body 300 are copper, an etching barrier layer made of nickel, chromium, iron or the like may be formed on the entirety of the upper surface of the support body 300 by electrolytic plating or the like. Thereafter, the wiring layer 10, the insulating layer 20 and the like may be stacked on the etching barrier layer in this order. Then, the support body 300 may be removed by etching, and then, the etching barrier layer may be removed by etching using etching solution that does not etch the wiring layer 10. With this, the wiring board is completed. In this case as well, the lower surface of the wiring layer 10 becomes flush with the lower surface of the first insulating film 21.

Various aspects of the subject-matter described herein are set out non-exhaustively in the following numbered clauses:

1. A method of manufacturing a wiring board, including:
forming a first wiring layer on one surface of a support body;
stacking a first insulating film at a semi-cured state composed of only resin on the one surface of the support body so as to cover the first wiring layer;
stacking a second insulating film at a semi-cured state including a reinforcing member impregnated with resin on one surface of the first insulating film; and
curing the first insulating film and the second insulating film to form an insulating layer in which the second insulating film is stacked on the first insulating film.

2. A method of manufacturing a wiring board, including:
forming a first wiring layer on one surface of a support body;
preparing an insulating layer including
a first insulating film at a semi-cured state composed of only resin, and
a second insulating film at a semi-cured state including a reinforcing member impregnated with resin and stacked on one surface of the first insulating film; and
adhering the insulating layer on the one surface of the support body so as to cover the first wiring layer while facing the first insulating film to the support body, and curing the insulating layer.

3. The method of manufacturing the wiring board according to clause 1 or 2, further including:
forming an open portion that penetrates the insulating layer to expose one surface of the first wiring layer.

4. The method of manufacturing the wiring board according to clause 3, further including:
forming a concave portion at a portion of the open portion in the first insulating film to expand an inner wall of the open portion in the first insulating film.

5. The method of manufacturing the wiring board according to clause 3 or 4, further including:
forming a second wiring layer including
a wiring pattern formed on the second insulating film, and
a via wiring formed in the open portion and connecting the wiring pattern and the first wiring layer.

6. The method of manufacturing the wiring board according to any one of clause 1 to 5, further including:
removing the support body.

7. The method of manufacturing the wiring board according to clause 6, further including:
stacking another insulating layer and another wiring layer on another surface of the first insulating.

What is claimed is:

1. A wiring board comprising:
an insulating layer including
a first insulating film provided with a first surface and a second surface that is opposite to the first surface, and composed of only resin, and
a second insulating film provided with a first surface and a second surface that is opposite to the first surface, including a reinforcing member and resin, in which the reinforcing member is impregnated with the resin, and stacked on the first surface of the first insulating film such that the second surface of the second insulating film contacts the first surface of the first insulating film and the second surface of the first insulating film is exposed outside; and
a first wiring layer embedded in the first insulating film, a lower surface of the first wiring layer being exposed in one or more openings in the second surface of the first insulating film,
wherein the first insulating film covers a side surface of the first wiring layer and an upper surface of the first wiring layer, the upper surface being opposite to the lower surface, and
wherein a hole exposing the upper surface of the first wiring layer penetrates through the first surface of the first insulating film and the second insulating film, the hole extending from the upper surface of the first wiring layer to the first surface of the second insulating film,
wherein the upper surface of the first wiring layer exposed in the hole functions as a pad for external connection, and
wherein the hole is narrowed on an interface between the first insulating film and the second insulating film such as to have a smallest width directly on the interface.

2. The wiring board according to claim 1,
wherein the lower surface of the first wiring layer exposed in the one or more openings in the second surface of the first insulating film composes a plurality of pads, and the wiring board further comprising:
a solder resist layer stacked on the second surface of the first insulating film and provided with an open portion that exposes the lower surface of the first wiring layer composing the plurality of pads.

3. The wiring board according to claim 1, wherein the second surface of the first insulating film is a chip mounting surface on which a semiconductor chip is to be mounted.

4. The wiring board according to claim 1, further comprising:
a third insulating layer and a fourth wiring layer stacked on the second surface of the first insulating film.

5. The wiring board according to claim 1, wherein the first insulating film includes filler.

6. The wiring board according to claim 1, further comprising:
a support body provided at the first surface of the second insulating film.

7. A semiconductor package comprising:
the wiring board according to claim 1; and
a semiconductor chip mounted on the second surface of the first insulating film.

8. The semiconductor package as claimed in claim 7, further comprising a solder bump with which the hole is filled, the solder bump protruding from the first surface of the second insulating film.

* * * * *